(12) United States Patent
Kawakami et al.

(10) Patent No.: US 8,416,022 B2
(45) Date of Patent: *Apr. 9, 2013

(54) POWER AMPLIFIER DEVICE

(75) Inventors: Tsuyoshi Kawakami, Tokyo (JP);
Kazuyasu Nishikawa, Tokyo (JP)

(73) Assignee: Renesas Electronics Corporation,
Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/450,184

(22) Filed: Apr. 18, 2012

(65) Prior Publication Data

US 2012/0262237 A1   Oct. 18, 2012

Related U.S. Application Data

(63) Continuation of application No. 13/034,216, filed on Feb. 24, 2011, now Pat. No. 8,183,930.

(30) Foreign Application Priority Data

Feb. 26, 2010 (JP) ................................. 2010-042840

(51) Int. Cl.
*H03F 3/68* (2006.01)

(52) U.S. Cl. .................................. 330/295; 330/124 R

(58) Field of Classification Search .................. 330/295, 330/124 R, 84, 126, 165, 276

See application file for complete search history.

(56) References Cited

U.S. PATENT DOCUMENTS

| | | | |
|---|---|---|---|
| 5,612,647 A | 3/1997 | Malec | |
| 6,097,615 A | 8/2000 | Dent | |
| 6,133,788 A | 10/2000 | Dent | |
| 6,480,465 B1 * | 11/2002 | Luu | 310/46 |
| 6,737,916 B2 | 5/2004 | Luu | |
| 7,612,612 B2 * | 11/2009 | Staszewski et al. | 330/295 |
| 7,777,572 B2 * | 8/2010 | Staszewski et al. | 330/295 |
| 7,880,547 B2 * | 2/2011 | Lee et al. | 330/295 |
| 8,049,563 B2 * | 11/2011 | Aoki et al. | 330/276 |
| 2002/0135422 A1 | 9/2002 | Aoki et al. | |

FOREIGN PATENT DOCUMENTS

JP    2005-503679    2/2005

* cited by examiner

*Primary Examiner* — Henry Choe
(74) *Attorney, Agent, or Firm* — McDermott Will & Emery LLP

(57) ABSTRACT

A power amplifier device that satisfies both delivering a high output and reducing the chip area occupied by the power amplifier device. Over a substrate, are primary inductors arranged in a generally circular geometry, a ground pattern, transistor pairs, and a secondary inductor. The ground pattern extends from a portion of a region inside the circular primary inductor into regions outside the primary inductor, and grounded at a plurality of points in the regions outside the primary inductor. The primary inductors are coupled to the ground pattern through transistors.

7 Claims, 19 Drawing Sheets

POWER AMPLIFIER DEVICE

CROSS-REFERENCE TO RELATED APPLICATIONS

This application is a Continuation of U.S. application Ser. No. 13/034,216 filed on Feb. 24, 2011, now U.S. Pat. No. 8,183,930, which claims priority of Japanese Patent Application No. 2010-42840 filed on Feb. 26, 2010, the entire contents of each of which are hereby incorporated by reference.

BACKGROUND OF THE INVENTION

The present invention relates to a power amplifier device that amplifies an input signal to a required voltage level.

For communication devices such as mobile phone terminals, important challenges are decreasing the chip area occupied by a power amplifier device and other built-in components and reducing the cost for them. For instance, Japanese Unexamined Patent Application Publication (Translation of PCT Application) No. 2005-503679 (patent document 1) discloses a distributed power amplifier device for amplifying a radio frequency (RF) signal efficiently and at low cost.

The power amplifier device according to the above document comprises a plurality of push-pull amplifiers which are coupled on another to form a circular geometry. Input signals of equal amplitude but with opposite phases are input to adjacent amplifiers (transistors) in each push-pull amplifier. A closed loop formed by coupling the plurality of push-pull amplifiers functions as a primary winding. The power amplifier device further comprises a secondary winding adapted to the geometry of the primary winding. The secondary winding combines power output by each of the push-pull amplifiers efficiently.

PRIOR ART DOCUMENT

Patent Document

[Patent Document 1]
Japanese Unexamined Patent Application Publication (Translation of PCT Application) No. 2005-503679

SUMMARY OF THE INVENTION

In the power amplifier device described in the above patent document, the transistors are arranged in regions outside of the transformer. However, considering a power amplifier device delivering output power in the order of several watts, a total of the areas for installing the transistors become large. The above arrangement encounters a problem in which the chip area occupied by the enter power amplifier device becomes large.

An object of this invention is to provide a power amplifier device of a type that combines the outputs of a plurality of transistor pairs which operate differentially, the power amplifier device satisfying both of delivering a high output and reducing the chip area occupied by the device.

This invention is summarized as below. A power amplifier device formed over a substrate comprises a primary inductor, a ground pattern, a plurality of transistor pairs, and a secondary inductor. The primary inductor comprises a plurality of inductor elements arranged in a generally circular geometry, when viewed from a direction perpendicular to the substrate. The ground pattern is provided to extend from a portion of a region inside the primary inductor which is circular into regions outside the primary inductor, when viewed from the direction perpendicular to the substrate, and grounded at a plurality of points in the regions outside the primary inductor. Each of the plurality of transistor pairs is provided for linking with each of the plurality of inductor elements. To both ends of each of the plurality of inductor elements, first main electrodes of first and second transistors forming a transistor pair in linkage with the inductor element are coupled respectively. Second main electrodes of the first and second transistors are coupled to the ground pattern in the region inside the primary inductor and have electrical conduction to the respective plurality of points. First and second signals in a pair as differential input signals are supplied to control electrodes of the first and second transistors, respectively. The secondary inductor which comprises one turn of winding or multiple turns of winding is provided circularly so as to surround the primary inductor and further combines and outputs combined signals of the first and second signals combined in each of the inductor elements by magnetically coupling to the primary inductor.

According to this invention, a plurality of transistor pairs are disposed in a region inside a transformer comprised of primary and secondary inductors or a region where a portion of the transistor pairs overlap with these inductors. Thus, the chip area occupied by the power amplifier device can be made smaller than that occupied by a comparable power amplifier known heretofore. Moreover, according to this invention, the ground pattern coupled to the second electrodes of the transistors is grounded at a plurality of points in regions outside the transformer. In consequence, it is possible to reduce parasitic resistances and parasitic inductances in the paths between the second electrodes and the ground nodes. A decrease in the output of the power amplifier device can be prevented.

DETAILED DESCRIPTION OF THE PREFERRED EMBODIMENTS

Figure 1:
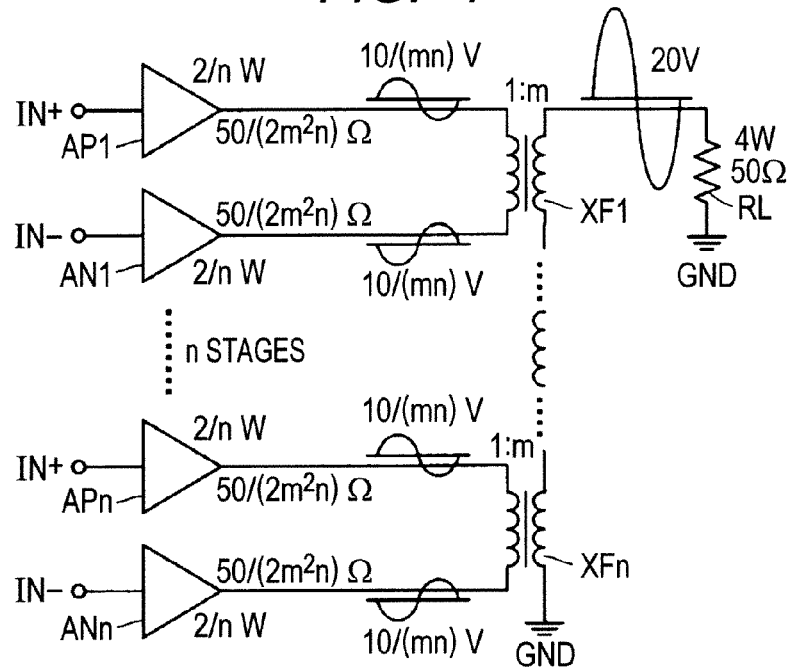
FIG. 1 is a circuit diagram showing a transformer-based power amplifier in which n stages of transformers with a turn ratio of 1:m are coupled together.

In the following, preferred embodiments of this invention will be described in detail with reference to the drawings. Same or corresponding parts are assigned same reference numerals or designators and their description is not repeated.

First Embodiment

[Principle of a Transformer-Based Power Amplifier]

To begin with, the principle of a transformer-based power amplifier which underlies this invention is described.

FIG. 1 is a circuit diagram showing a transformer-based power amplifier in which n stages of transformers with a turn ration of 1:m are coupled together. Referring to FIG. 1, the transformer-based power amplifier includes n pieces (n is an integer of 2 or more) of transformers XF1 to XFn and n pairs of transistors (AP1, AN1) to (APn, ANn), each pair being provided for linking with each of the transformers XF1 to XFn. Transistors AP, AN in each pair are respectively coupled to both ends of a primary winding of a transformer XF in linkage with the pair. Secondary windings of the transformers XF1 to XFn are coupled in series to a load resistance RL.

Each amplifier pair AP, AN is comprised of source-grounded NMOS (N-channel Metal Oxide Semiconductor) transistors (N-channel insulated gate field effect transistors). Hereinafter, the amplifier pair AP, AN may also referred to as a transistor pair AP, AN. To each gate of a transistor pair AP, AN, differential signals, i.e., two signals having the same amplitude, but opposite phases IN+, IN− (first and second signals) are input.

In the circuit configuration of FIG. 1, the output voltage of the transistors can be made to 1/(2 nm) by coupling the n stages of transformers XF with a turn ratio of 1:m. For example, given that the output of the transformer-based power amplifier is 4 W and the load resistance RL is 50Ω, the output voltage amplitude (zero to peak) of the transformers XF1 to XFn whose secondary windings are coupled in series is 20V. In this case, the voltage amplitude at the drain of each transistor becomes 10/mn V. At this time, since the converted magnitude (load impedance) of the load resistance RL at the primary winding of each transformer XF is $50/(2\,m^2 n)\Omega$, the drain current amplitude per transistor becomes 0.4 mA, which is not dependent on the number n of stages. Hence, the transformer-based power amplifier becomes a useful means for realizing a power amplifier device delivering output power in the order of several watts by a micro CMOS process.

[Configuration of a Power Amplifier Device 300 of First Embodiment]

Figure 2:
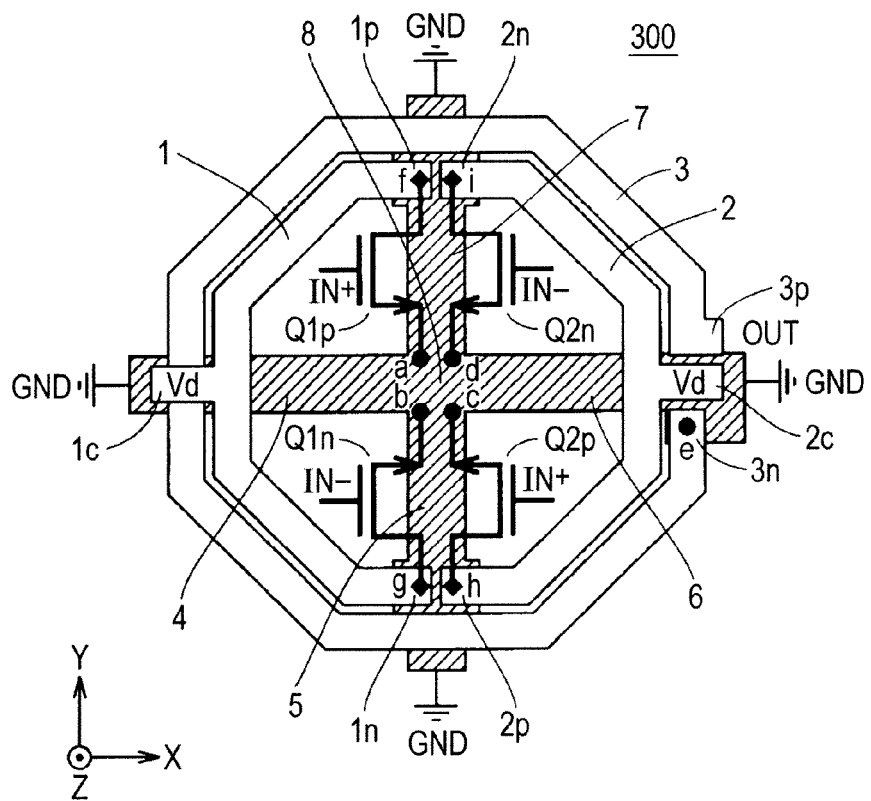
FIG. 2 is a plan view showing a configuration of a power amplifier device 300 according to a first embodiment of this invention.

FIG. 2 is a plan view showing a configuration of a power amplifier device 300 according to a first embodiment of this invention. The power amplifier device 300 shown in FIG. 2 is formed over a substrate and includes a primary inductor (denoted by a reference numeral 104 in FIG. 3) comprised of inductor elements 1, 2, a secondary inductor 3, a ground pattern (denoted by a reference numeral 102 in FIG. 3), and two pairs of transistors (Q1p, Q1n) and (Q2p, Q2n). Hereinafter, a plane that is parallel to the substrate is assumed as an XY plane and a direction that is vertical to the substrate is assumed as a Z direction. To discriminate between two directions along the coordinate axis, they are marked with positive and negative signs, such as +Z direction and −Z direction.

Figure 3A:
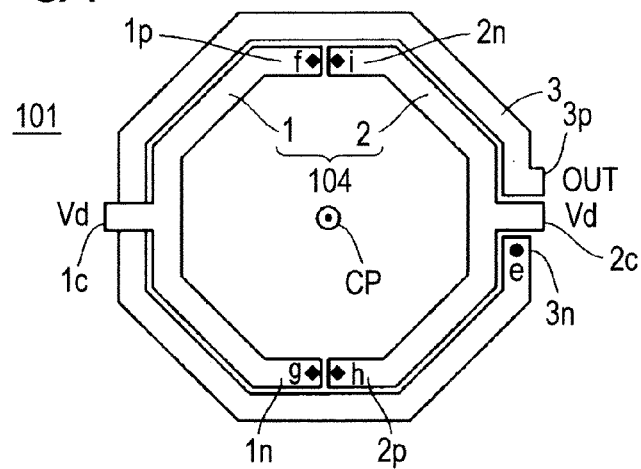
FIGS. 3(A), 3(B), and 3(C) are plan views showing each of the components of the power amplifier device 300 in FIG. 2.
Figure 3B:
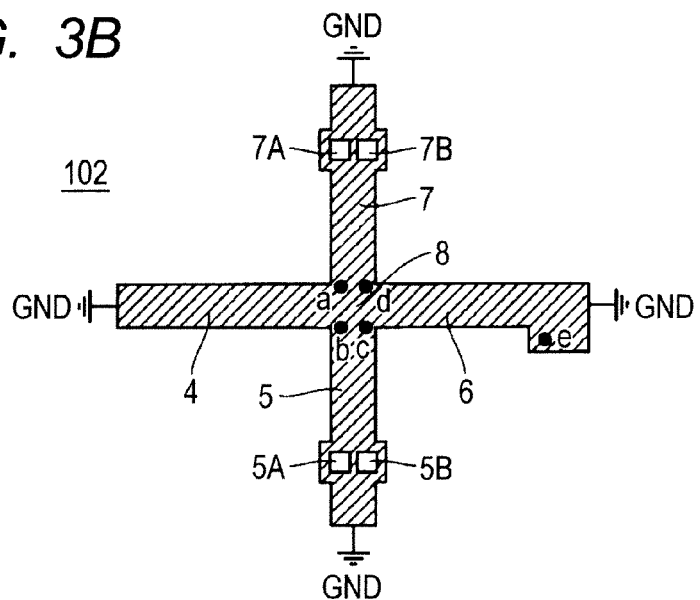
Figure 3C:
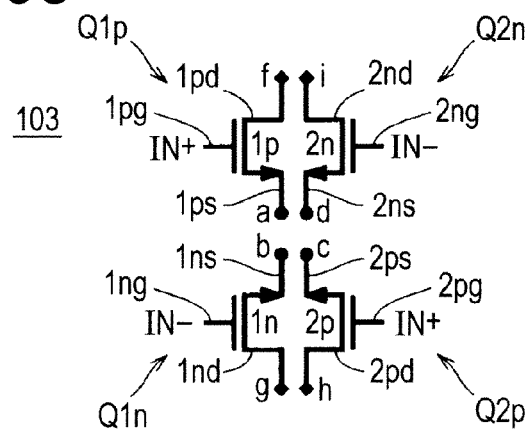

FIGS. 3(A), 3(B), and 3(C) are plan views showing each of the components of the power amplifier device 300 in FIG. 2. FIG. 3(A) is a plan view of a transformer 101 comprised of the primary inductor 104 and the secondary inductor 3. FIG. 3(B) is a plan view of the ground pattern 102. FIG. 3(C) is a diagram schematically illustrating an arrangement of the transistor pairs Q1p, Q1n and Q2p, Q2n (which are generically referred to as an amplifier 103). In the case of the first embodiment, each transformer is assumed to have a turn ratio of 1:1 and two stages are assumed to be coupled together.

Figure 4:
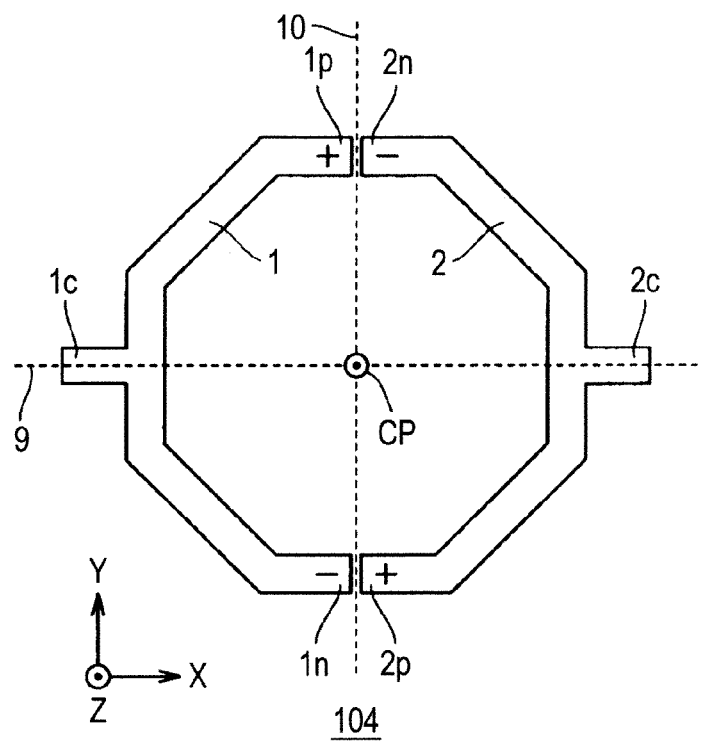
FIG. 4 is a plan view showing a primary inductor 104 part extracted from FIG. 3(A)

FIG. 4 is a plan view showing the primary inductor 104 part extracted from FIG. 3(A). With reference to FIG. 4, the primary inductor 104 is comprised of inductor elements 1, 2 arranged in a generally circular geometry around a central axis CP that is vertical to the substrate. The entire form of the primary inductor 104 is two-turn symmetrical around the central axis CP and mirror symmetrical with respect to each of a symmetry plane 9 and a symmetry plane 10 which are both parallel to an XZ plane. One end 1p of an inductor element 1 and one end 2n of an inductor element 2 are disposed close to each other across the symmetry plane 10 and the other end 1n of the inductor element 1 and the other end 2p of the inductor element 2 are disposed close to each other across the symmetry plane 10.

Referring to FIG. 2 and FIG. 3(A) again, the secondary inductor 3 is arranged circularly so as to surround the primary inductor 104. The secondary inductor 3 produces a combined output of signals which have been input to the inductor elements by magnetically coupling to the primary inductor 104. In a case where the power amplifier device 300 provides differential outputs, differential signals are output from both ends 3p, 3n of the secondary inductor 3. In a case where the power amplifier device 300 provides a single phase output, one end 3n is grounded and a single phase output signal OUT is output from the other end 3p. In the latter case, the end 3n may be grounded by coupling it to the ground pattern 102 via a contact hole e. Although the secondary inductor 3 shown in FIG. 2 and FIG. 3(A) has one turn of winding, it may have multiple turns of winding.

The ground pattern 102 includes wiring portions 4 to 7 and a junction portion 8. When viewed from a direction perpendicular to the substrate, a wiring portion 4 extends from the vicinity of the central axis CP in an X direction along the symmetry plane 9 in FIG. 4 and into a region outside of the transformer 101 and its end terminal is grounded. When viewed from the direction perpendicular to the substrate, a wiring portion 5 extends from the vicinity of the central axis CP in a Y direction along the symmetry plane 10 in FIG. 4 and into a region outside of the transformer 101 and its end terminal is grounded. When viewed from the direction perpendicular to the substrate, a wiring portion 6 extends from the vicinity of the central axis CP in the X direction along the symmetry plane 9 in FIG. 4 and into a region outside of the transformer 101 and its end terminal is grounded. When viewed from the direction perpendicular to the substrate, a wiring portion 7 extends from the vicinity of the central axis CP in the Y direction along the symmetry plane 10 in FIG. 4 and into a region outside of the transformer 101 and its end terminal is grounded. The junction portion 8 is provided in the vicinity of the central axis CP and joins the wiring portions 4 to 7.

The transistors Q1p, Q1n, Q2p, Q2n are embodied by NMOS transistors and arranged inside the rim of the transformer 101, when viewed from the direction perpendicular to the substrate. When viewed from the direction perpendicular to the substrate, the wiring of the transformer 101 and each transistor may partially overlap. The transistors forming the transistor pairs are not limited to NMOS transistors; however, they may be, for example, bipolar transistors. Concrete coupling of each transistor is as below.

A drain electrode 1pd of a transistor Q1p is coupled to the end 1p of the inductor element 1 via a contract hole f and a source electrode 1ps thereof is coupled to the junction portion 8 via a contact hole a. A drain electrode 1nd of a transistor Q1n is coupled to the end 1n of the inductor element 1 via a contract hole g and a source electrode 1ns thereof is coupled to the junction portion 8 via a contact hole b. A drain electrode 1pd of a transistor Q2p is coupled to the end 2p of the inductor element 2 via a contract hole h and a source electrode 2ps thereof is coupled to the junction portion 8 via a contact hole c. A drain electrode 2nd of a transistor Q2n is coupled to the end 2n of the inductor element 2 via a contract hole i and a source electrode 2ns thereof is coupled to the junction portion 8 via a contact hole d.

A DC bias voltage is supplied to each transistor pair via the inductor element in linkage with the transistor pair. Specifically, as shown in FIG. 2, a DC bias voltage Vd which is supplied to the transistors Q1P, Q1n is applied to a center tap 1c in the vicinity of a midpoint of the inductor element 1. A DC bias voltage Vd which is supplied to the transistors Q2P, Q2n is applied to a center tap 2c in the vicinity of a midpoint of the inductor element 2.

Input signals IN+, IN− as differential input signals are input to the gate electrodes of the transistors Q1P, Q1n and to the gate electrodes of the transistors Q2P, Q2n, respectively. Thereby, the input signals IN+, IN− are amplified by the transistors Q1P, Q1n and then combined by the inductor element 1. Similarly, the input signals IN+, IN− are amplified by the transistors Q2P, Q2n and then combined by the inductor element 2. The signals thus combined by the inductor elements 1, 2 are further combined by the secondary inductor 3 and then output from the terminal 3p.

Figure 5:
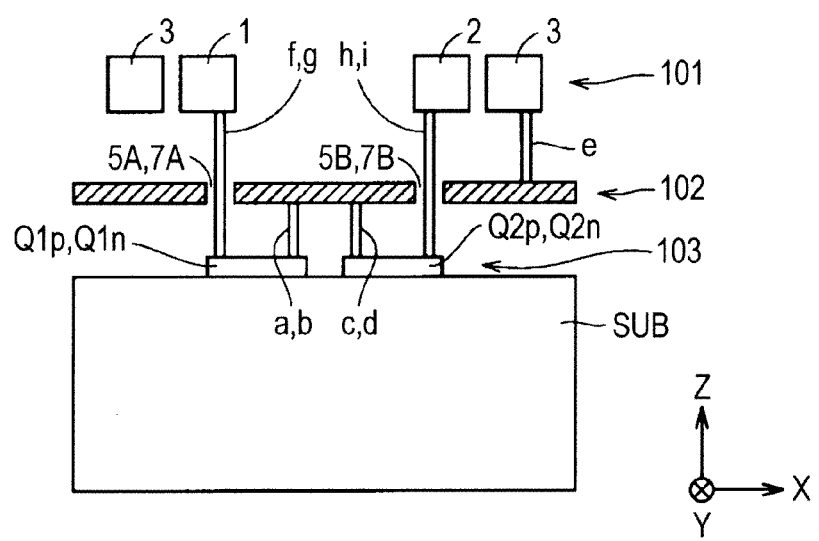
FIG. 5 is a schematic cross-sectional diagram to explain the cross-section structure of the power amplifier device 300 shown in FIG. 2.

FIG. 5 is a schematic cross-sectional diagram to explain the cross-section structure of the power amplifier device 300 shown in FIG. 2. The schematic cross-sectional diagram of FIG. 5 is intended to explain the locations of metal layers and the couplings via contact holes and does not exactly correspond to the plan view of FIG. 2.

Referring to FIG. 5, the transistors Q1p, Q1n, Q2p, Q2n are formed using a first metal layer over the substrate SUB. The ground pattern 102 is formed using a second metal layer above the first metal layer. The transformer 101 is formed using a third metal later above the second metal layer.

Contract holes a, b, c, d are formed to couple the transistors Q1p, Q1n, Q2p, Q2n and the ground pattern 102. Contact holes f, g, h, i, are formed to couple the transistors Q1p, Q1n, Q2p, Q2n and the inductor element 1. In this case, openings 7A, 5A, 5B, 7B, as shown in FIG. 3(B), are formed to allow the contact holes f, g, h, i, to pass therethrough.

Figure 6A:
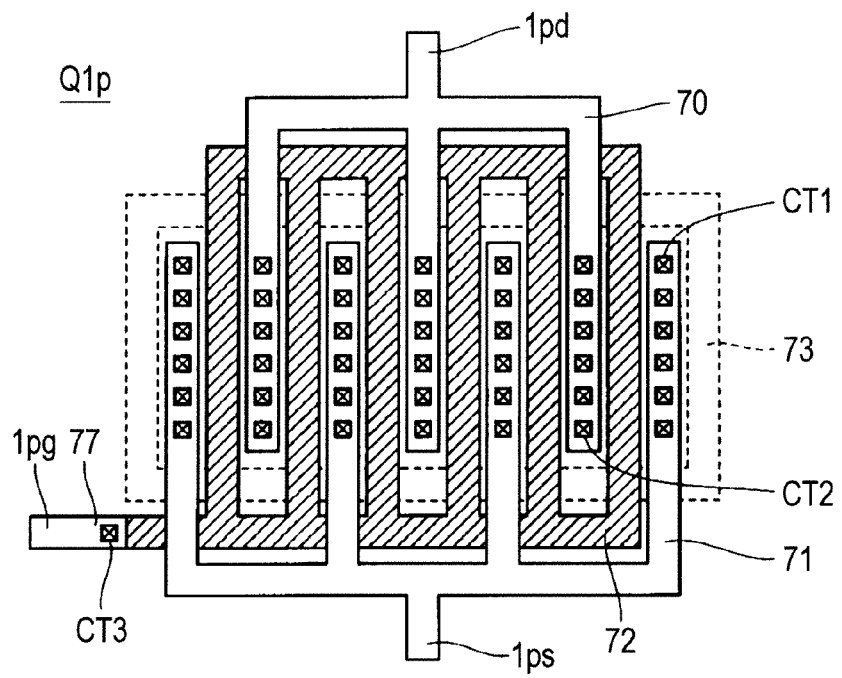
FIGS. 6(A) and 6(B) are plan views showing the structure of a transistor Q1p in greater detail.
Figure 6B:
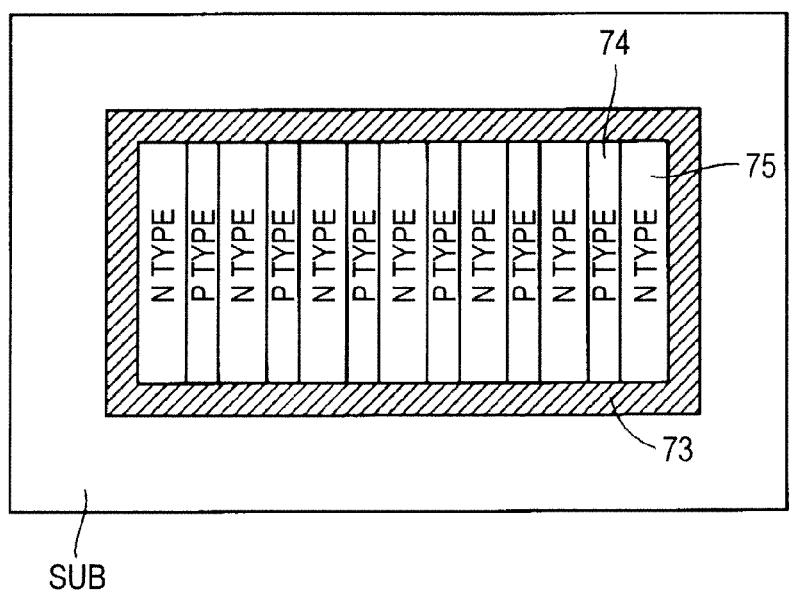

FIGS. 6(A) and 6(B) are plan views showing the structure of a transistor Q1p in greater detail. FIG. 6(A) shows the locations of the drain electrode 1pd, the source electrode fps, and the gate electrode 1pg and FIG. 6(B) shows the locations of p-type impurity regions 74, n-type impurity regions 75, and a trench isolation region 73 on the surface of the substrate SUB. The p-type impurity regions 74 are used as channel regions of the NMOS transistor and the n-type impurity regions 75 are used as drain and source regions alternately. In FIGS. 6(A) and 6(B), the structure of the transistor Q1p is shown as a representative; obviously, other transistors Q1n, Q2p, Q2n have the same structures as shown here.

An aluminum wiring 70 forming the drain electrode 1pd is coupled to the drain regions via a plurality of contact holes CT2. An aluminum wiring 71 forming the source electrode 1ps is coupled to the source regions via a plurality of contact holes CT1. Aluminum wirings 71 which respectively form the source electrodes 1ps of the transistors Q1p, Q1n, Q2p, Q2n in FIG. 2 may be formed to be inter-coupled together and unified.

The gate electrode 1pg includes a polysilicon layer 72 laminated on top of a gate insulating film over the channel regions and an aluminum wiring 77 coupled to the polysilicon layer 72 via a contact hole CT3. The aluminum wiring 77 is formed using the first metal layer as mentioned in FIG. 5. In FIG. 6(A), the polysilicon layer is hatched in order to clarify the illustration.

[Advantageous Effects of the Power Amplifier Device 300]

According to the above-described power amplifier device 300, firstly, the chip area occupied by the power amplifier device can be made smaller than that occupied by a comparable power amplifier known heretofore by arranging the transistors Q1p, Q1n, Q2p, Q2n in an area inside the rim of the transformer 101.

Secondly, the four wiring portions 4 to 7 provide parallel couplings between the source electrodes of the transistors Q1p, Q1n, Q2p, Q2n and the ground nodes GND. As a result, it is possible to reduce parasitic resistances and parasitic inductances in the paths from the source electrodes of the transistors to the ground nodes GND and a decrease in the output of the power amplifier device 300 can be inhibited.

Thirdly, the wiring portions 4 to 7 forming the ground pattern 102 run though the mirror symmetry planes 9, 10 in the primary inductor 104 as shown in FIG. 4. Because the mirror symmetry planes 9, 10 serve as virtual AC grounds in differential operation, the RF characteristic of the transformer 101 is less affected by the wiring portions 4 to 7. Consequently, the width of the grounding wires can be made wider than in a case where the grounding wires are placed in other positions and it is possible to further reduce parasitic resistances in the paths from the ground terminals of the transistors to the grounds. Moreover, because the ground pattern 102 as a whole has a mirror symmetrical property nearly like the primary inductor 104, an unbalanced differential operation is hard to take place. In the following, the advantageous effects of the power amplifier device 300 will be further described, while giving a concrete example and comparison examples.

Figure 7:
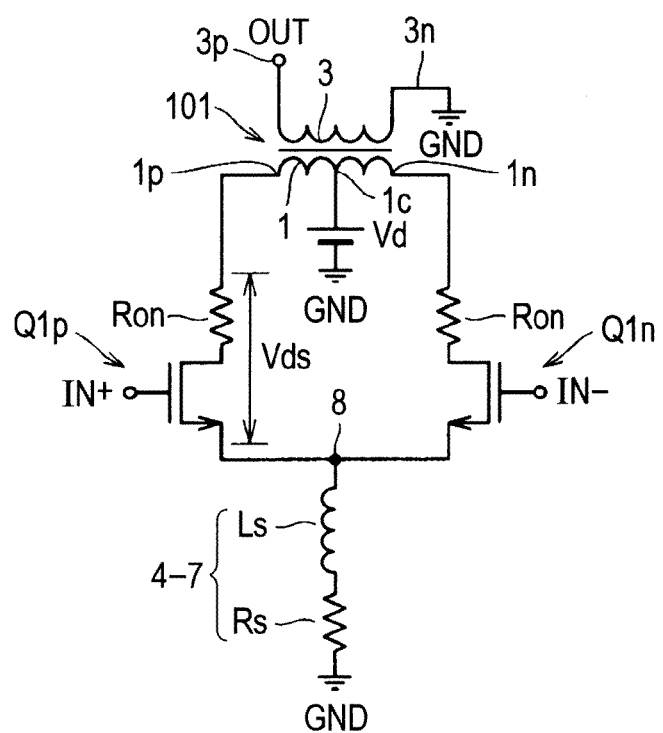
FIG. 7 is an equivalent circuit diagram for the power amplifier device 300 in FIG. 2.

FIG. 7 is an equivalent circuit diagram for the power amplifier device 300 in FIG. 2. In FIG. 7, the inductor element 1 and the transistor pair Q1p, Q1n coupled to it are shown.

In FIG. 7, the on-resistance of the transistors Q1p, Q1n is denoted by Ron, the resistance of the parallel wiring portions 4 to 7 from the junction portion 8 to the ground nodes GND is denoted by Rs, and the inductance of the parallel wiring portions is denoted by Ls. In this case, a DC voltage Vds (drain-source voltage) that is applied to each transistor Q1p, Q1n is expressed by the following equation:

$$Vds=Vd\times(Ron/2)\times(Ron/2+Rs). \quad (1)$$

As is evident from Equation (1), as the parasitic resistance Rs increases, the DC voltage Vds that is applied to the transistor decreases. In consequence, the output OUT of the power amplifier device decreases. However, in the case of the power amplifier device 300 of the first embodiment, the parasitic resistance Rs is made as small as possible by providing several wiring portions 4 to 7 and, therefore, a decrease in the output OUT can be inhibited.

In FIG. 7, the parasitic inductance Ls of the grounding wires does not affect the DC voltage, but has an effect on the RF signal as impedance as large as ω·Ls (where ω is an angular frequency). In the case of the first embodiment, if the differential operation of the power amplifier device is ideal, because the junction portion 8 serves as a virtual AC ground, the parasitic inductance Ls has no effect on the output OUT of the power amplifier device 300. Nevertheless, if differential input signals IN+, IN− are asymmetric, or if the characteristics of the transistors vary within the board surface, the differential operation of the power amplifier device will become unbalanced. In that event, it is possible to inhibit a decrease in the output OUT by making the parasitic inductance Ls as small as possible.

Figure 8:
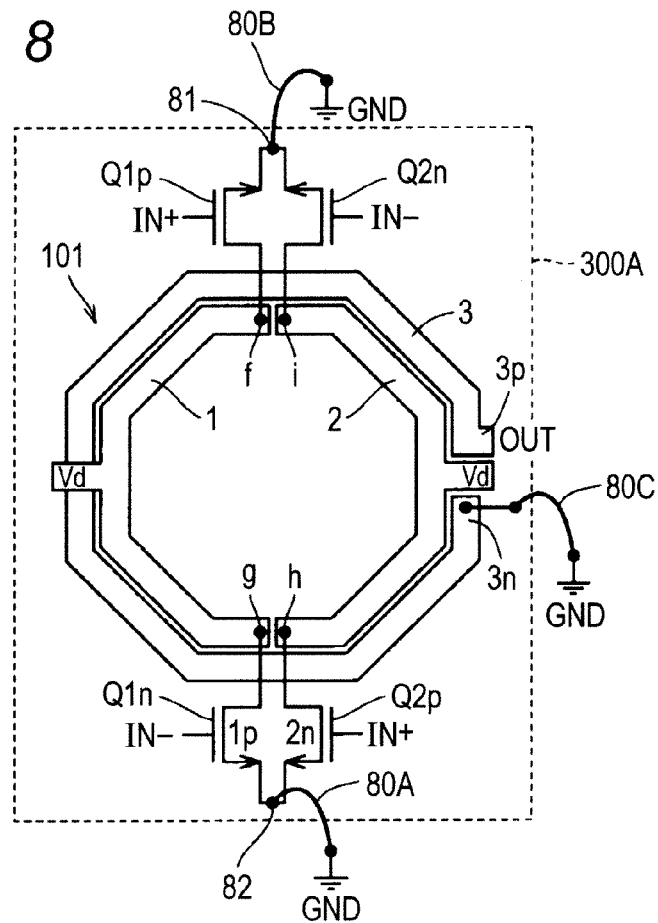
FIG. 8 is a diagram showing a configuration of a power amplifier device 300A as a first comparison example against the first embodiment.

FIG. 8 is a diagram showing a configuration of a power amplifier device 300A as a first comparison example against the first embodiment. In FIG. 8, an example is shown where the transistors Q1p, Q1n, Q2p, Q2n are arranged in an area outside the transformer 101.

In the power amplifier device of a type that combines the outputs of a plurality of differentially operating transistor pairs, the transistors Q1p, Q1n, Q2p, Q2n are often disposed outside the transformer, as shown in FIG. 8. In this case, a common source electrode 81 of the transistors Q1p, Q2n can be coupled to a ground node GND via a boding wire 80B and a common source electrode 82 of the transistors Q1n, Q2p can be coupled to a ground node GND via a bonding wire 80A.

Thus, it is possible to reduce parasitic resistances and parasitic inductances in the paths between the source electrodes of the transistors Q1p, Q1n, Q2p, Q2n and the ground nodes GND. However, because a larger area is needed to install the transistors for the power amplifier device that delivers output power in the order of several watts, the chip area occupied by the entire power amplifier device as shown in FIG. 8 becomes larger than the power amplifier device of the first embodiment.

In the power amplifier device 300 of the first embodiment, the entire power amplifier device is designed to occupy a smaller chip area by disposing the transistors inside the transformer. Further, by providing the wiring portions 4 to 7 for grounding so as to be vertically mirror symmetrical with respect to the symmetry planes 9, 10, it is possible to make the parasitic resistances and parasitic inductances as small as possible.

Figure 9:
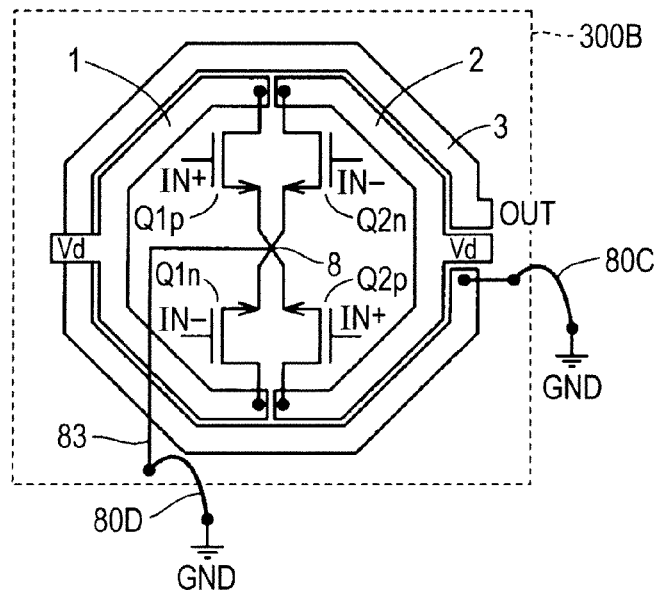
FIG. 9 is a diagram showing a configuration of a power amplifier device 300B as a second comparison example against the first embodiment.

FIG. 9 is a diagram showing a configuration of a power amplifier device 300B as a second comparison example against the first embodiment. In FIG. 9, an example is shown where the transistors Q1p, Q1n, Q2p, Q2n are arranged in an area inside the transformer 101. In the case of FIG. 9, however, the junction portion 8 is coupled to a ground node GND by a single wiring portion 83 and a bonding wire 80D.

In the case of FIG. 9, the wiring portion 83 has a parasitic resistance and a parasitic inductance that are at least four times as much as the total parasitic resistance and parasitic inductance of the wiring portions 4 to 7 in FIG. 2. Further, the wiring portion 83 is placed so as not to be mirror symmetrical with respect to the symmetry planes 9, 10. Consequently, the output OUT will become lower than the output of the power amplifier device 300 according to the first embodiment.

[Examples of Modifications to the First Embodiment]

Figure 10:
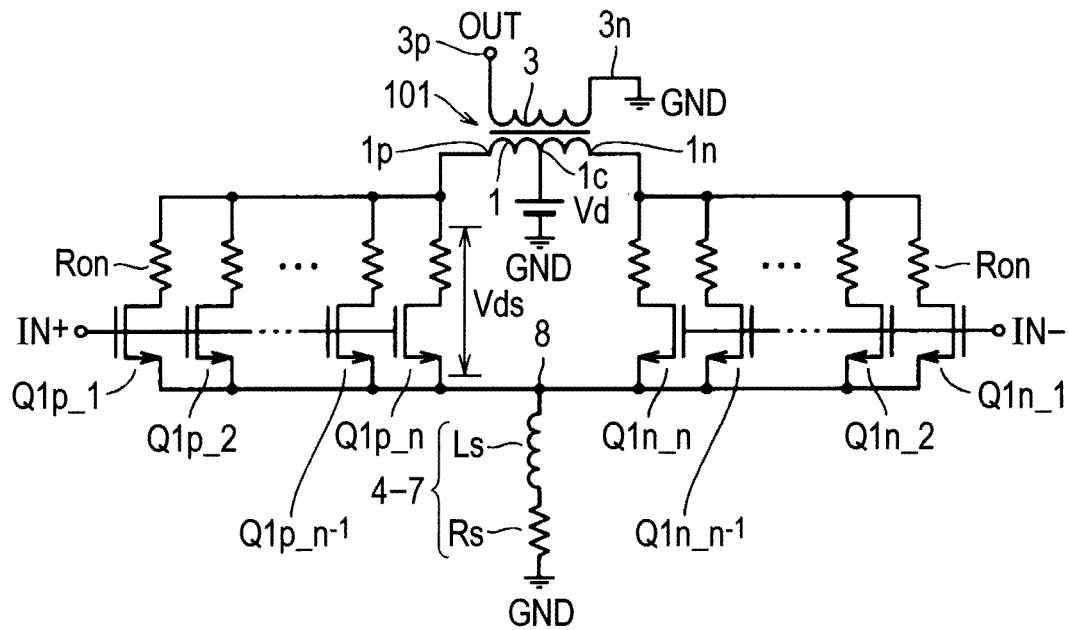
FIG. 10 is a circuit diagram showing a configuration of a power amplifier device as a first example of modification to the first embodiment.

FIG. 10 is a circuit diagram showing a configuration of a power amplifier device as a first example of modification to the first embodiment. In FIG. 10, an example is shown where differential pairs comprise n pairs of parallel transistors. In the circuit diagram of FIG. 10, only the transistors for the inductor element 1 in FIG. 2 are shown, but the transistors for the inductor element 2 are assumed to be provided as shown here.

The power amplifier device in FIG. 10 includes n pieces of transistors Q1p_1 to Q1p_n coupled in parallel between the end 1p of the inductor element 1 and the junction portion 8 and a pieces of transistors Q1n_1 to Q1n_n coupled in parallel between the end 1n thereof and the junction portion 8. A first signal IN+ is input to the gate electrodes of the Q1p_1 to Q1p_n and a second signal IN− is input to the gate electrodes of the transistors Q1n_1 to Q1n_n.

In this case, a DC voltage Vds (drain-source voltage) that is applied to the n pieces of parallel-coupled transistors is expressed by the following equation:

$$Vds=Vd\times(Ron/2n)\times(Ron/2n+Rs). \quad (2)$$

As is evident from Equation (2), as the number of parallel transistors increases by n times (that is, a total of the areas for installing the transistors increases by n times), the on-resistance Ron of the transistors decreases to 1/n. Consequently, because of the resistance division, the parasitic resistances Rs in the paths from the junction portion 8 to the ground nodes GND result in a larger voltage fall. There will be a significant decrease in the DC voltage Vds that is applied to the transistors as compared with a case in which a single transistor is installed.

If several wiring portions 4 to 7 provide parallel couplings between the junction portion 8 and the ground nodes GND, as shown in FIG. 2, it is possible to inhibit the decrease in the DC voltage Vds that is applied to the transistors. Other respects in FIG. 10 are the same as in the circuit diagram of FIG. 7 and, therefore, same or corresponding parts are assigned the same reference designators and their description is not repeated.

Figure 11:
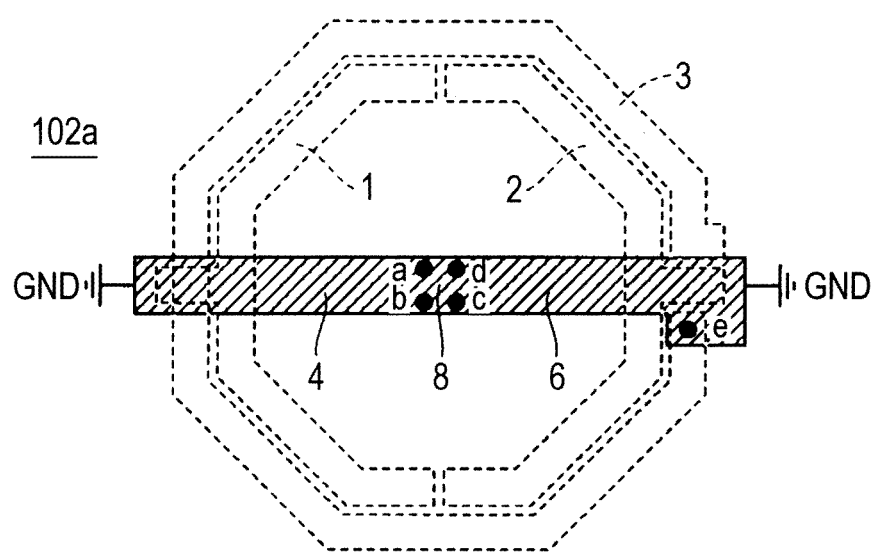
FIG. 11 is a plan view showing a ground pattern 102a as a second example of modification to the first embodiment.

FIG. 11 is a plan view showing a ground pattern 102a as a second example of modification to the first embodiment. In FIG. 11, the layout of the primary inductors 1, 2 and secondary inductor 3 is also shown.

As shown in FIG. 11, the ground pattern 102a may be configured with only the wiring portions 4, 6 and the junction portion 8 along the mirror symmetry plane 9 in FIG. 4. In this case, parasitic resistances and parasitic inductances in the paths between the junction portion 8 and the ground nodes GND become larger than in the case of FIG. 2, but can be made smaller than in the case of the comparison example in FIG. 9.

Figure 12:
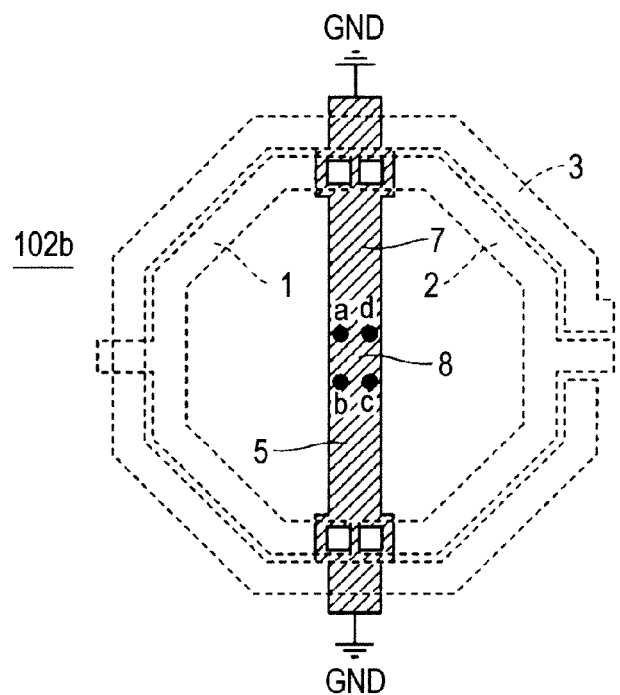
FIG. 12 is a plan view showing a ground pattern 102b as a third example of modification to the first embodiment.

FIG. 12 is a plan view showing a ground pattern 102b as a third example of modification to the first embodiment. In FIG. 12, the layout of the primary inductors 1, 2 and secondary inductor 3 is also shown.

As shown in FIG. 12, the ground pattern 102b may be configured with only the wiring portions 5, 7 and the junction portion 8 along the mirror symmetry plane 10 in FIG. 4. In this case, parasitic resistances and parasitic inductances in the paths between the junction portion 8 and the ground nodes GND become larger than in the case of FIG. 2, but can be made smaller than in the case of the comparison example in FIG. 9.

Second Embodiment

While the first embodiment has illustrated the example of the power amplifier device in which the transformer combines the outputs of two pairs of differentially operating transistors, the same function/effect can be achieved even if the number of pairs of such transistors is varied.

[Configuration of a Power Amplifier Device 301]

Figure 13:
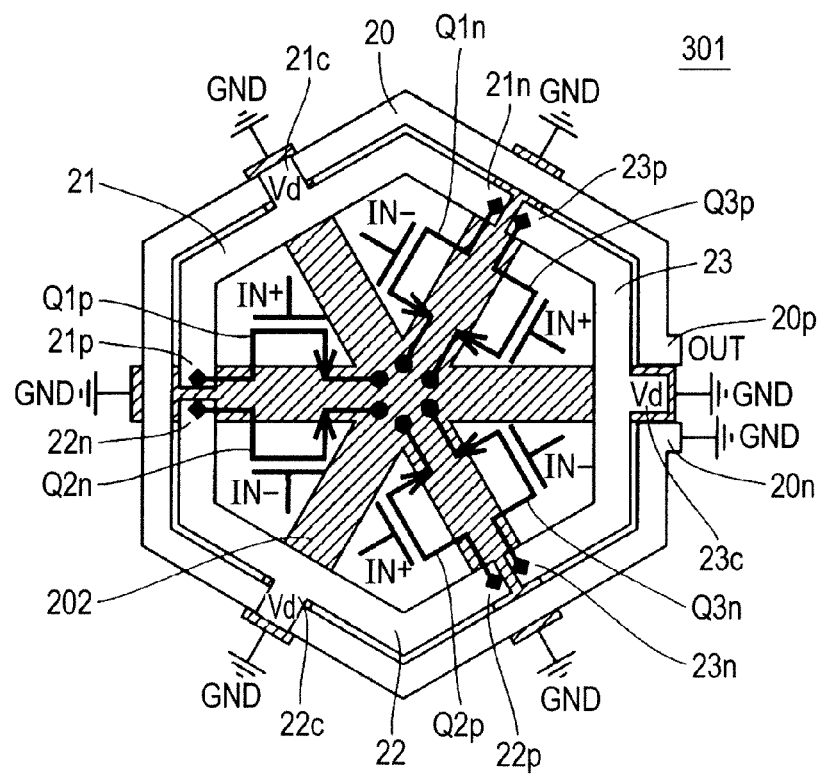
FIG. 13 is a plan view showing a configuration of a power amplifier device 301 according to a second embodiment of this invention.

FIG. 13 is a plan view showing a configuration of a power amplifier device 301 according to a second embodiment of this invention. The power amplifier device 301, as shown in FIG. 13, provided over a substrate includes a primary inductor (denoted by a reference numeral 201 in FIG. 14) comprised of inductor elements 21, 22, 23, a secondary inductor 20, a ground pattern (denoted by a reference numeral 202 in FIG. 15), and three pairs of transistors (Q1p, Q1n), (Q2p, Q2n), (Q3p, Q3n).

Figure 14:
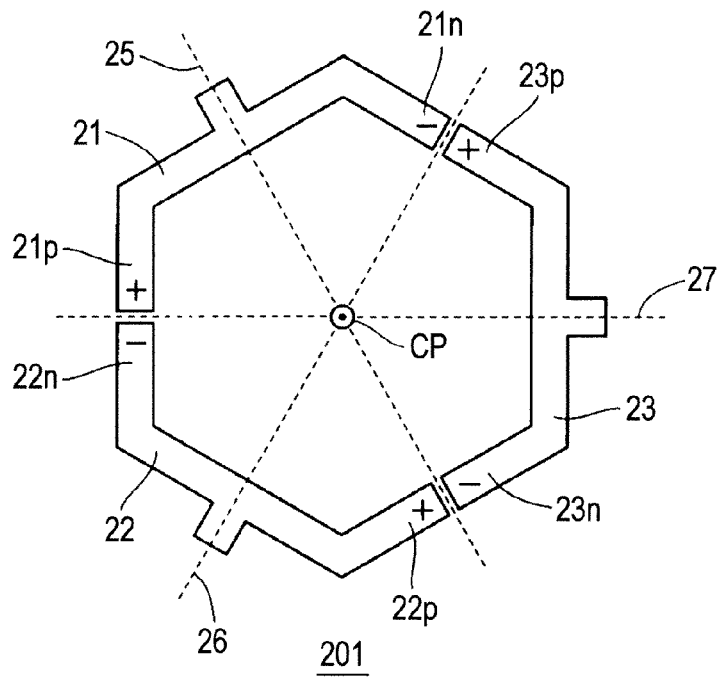
FIG. 14 is a plan view showing a primary inductor part extracted from FIG. 13.

FIG. 14 is a plan view showing the primary inductor part extracted from FIG. 13. With reference to FIG. 14, the primary inductor 201 is comprised of the inductor elements 21, 22, 23 arranged in a generally circular geometry around the central axis CP that is vertical to the substrate. The entire form of the primary inductor 201 is three-turn symmetrical around the central axis CP and mirror symmetrical with respect to each of symmetry planes 25, 26, 27, each of which includes the central axis CP.

Figure 15:
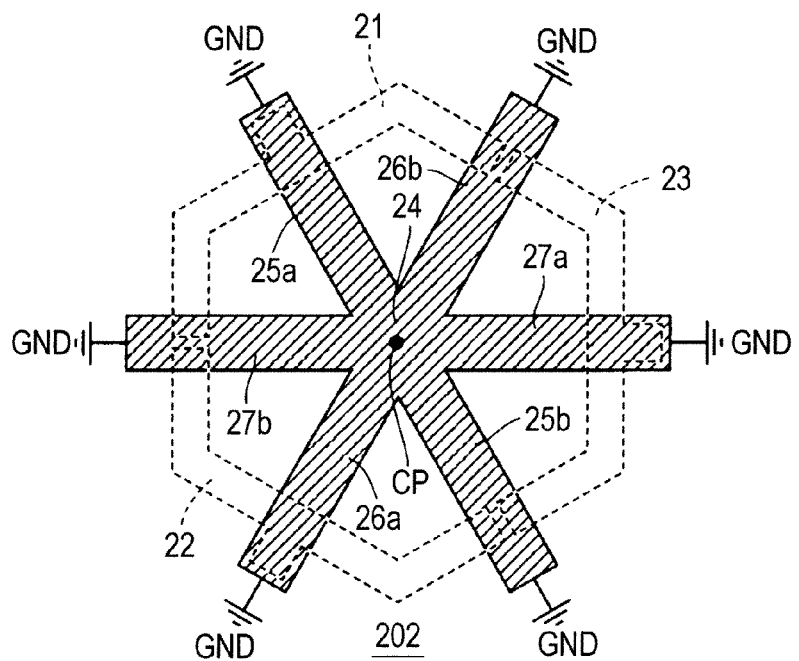
FIG. 15 is a plan view showing a ground pattern part extracted from FIG. 13.

FIG. 15 is a plan view showing the ground pattern part extracted from FIG. 13. With reference to FIG. 15, the ground pattern 202 includes wiring portions 25a, 25b, 26a, 26b, 27a, 27b, and a junction portion 24. When viewed from the direction perpendicular to the substrate, wiring portions 25a, 25b are laid along a symmetry plane 25 in FIG. 14 and coupled together in the junction portion 24 in the vicinity of the central axis CP in FIG. 14. The wiring portions 25a, 25b are grounded respectively in regions outside of the circular primary inductor 201 (21, 22, 23). When viewed from the direction perpendicular to the substrate, wiring portions 26a, 26b are laid along a symmetry plane 26 in FIG. 14 and coupled together in the junction portion 24. The wiring portions 26a, 26b are grounded respectively in regions outside of the circular primary inductor 201. When viewed from the direction perpendicular to the substrate, wiring portions 27a, 27b are laid along a symmetry plane 27 in FIG. 14 and coupled together in the junction portion 24. The wiring portions 27a, 27b are grounded respectively in regions outside of the circular primary inductor 201. Openings like those shown in FIG. 3(B) are further provided in the wiring portions 25a, 25b, 26a, 26b, 27a, 27b in FIG. 15, but the openings are omitted from the illustration here. The ground pattern 202 has rotational symmetries with respect to the same rotational symmetry axis CP as for the primary inductor 201 and has mirror symmetries with respect to the same mirror symmetry planes 25, 26, 27 as for the primary inductor 201.

Referring to FIG. 13 again, the secondary inductor 20 is arranged circularly so as to surround the primary inductor 201 (21, 22, 23). The secondary inductor 20 produces a combined output of signals which have been input to the inductor elements by magnetically coupling to the primary inductor 201. In a case where the power amplifier device 301 provides differential outputs, differential signals are output from both ends 20p, 20n of the secondary inductor 20. In a case where the power amplifier device 301 provides a single phase output, one end 20n is grounded and a single phase output signal OUT is output from the other end 20p. Although the secondary inductor 20 shown in FIG. 13 has one turn of winding, it may have multiple turns of winding.

Drain electrodes of transistors Q1p, Q1n are coupled to the ends 21p, 21n of the inductor element 21, respectively, and source electrodes thereof are coupled to the junction portion (denoted by a reference numeral 24 in FIG. 15). First and second signals IN+, IN− as differential input signals are input to gate electrodes of the transistor pair Q1p, Q1n. A bias voltage Vd for the transistors Q1p, Q1n is applied to a center tap 21c in the vicinity of a midpoint of the inductor element 21.

Drain electrodes of transistors Q2p, Q2n are coupled to the ends 22p, 22n of the inductor element 22, respectively, and source electrodes thereof are coupled to the junction portion (denoted by the reference numeral 24 in FIG. 15). First and second signals IN+, IN− as differential input signals are input to gate electrodes of the transistor pair Q2p, Q2n. A bias voltage Vd for the transistors Q2p, Q2n is applied to a center tap 22c in the vicinity of a midpoint of the inductor element 22.

Drain electrodes of transistors Q3p, Q3n are coupled to the ends 23p, 23n of the inductor element 23, respectively, and source electrodes thereof are coupled to the junction portion (denoted by the reference numeral 24 in FIG. 15). First and second signals IN+, IN− as differential input signals are input to gate electrodes of the transistor pair Q3p, Q3n. A bias voltage Vd for the transistors Q3p, Q3n is applied to a center tap 23c in the vicinity of a midpoint of the inductor element 23.

By the application of the ground pattern 202, parasitic resistances and parasitic inductances in the paths from the source electrodes of the transistors to the ground nodes GND are reduced by a factor of 6, roughly, as compared with the comparison example in FIG. 9.

[Examples of Modifications to the Ground Pattern]

Figure 16:
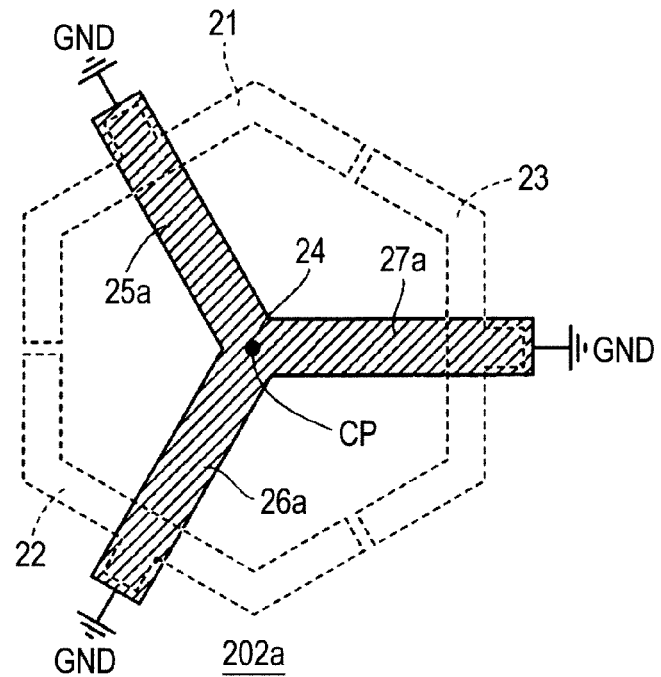
FIG. 16 is a plan view showing a configuration of a ground pattern 202a as an example of modification to the ground pattern 202 in FIG. 15.

FIG. 16 is a plan view showing a configuration of a ground pattern 202a as an example of modification to the ground pattern 202 in FIG. 15. In FIG. 16, the layout of the primary inductor 201 (21, 22, 23) is also shown.

As shown in FIG. 16, the ground pattern 202a may be configured with only the wiring portions 25a, 26a, 27a and the junction portion 24 in FIG. 14. The entire form of the ground pattern 202a is three-turn symmetrical with respect to the central axis CP in FIG. 14 and mirror symmetrical with respect to each of the symmetry planes 25, 26, 27. In this case, parasitic resistances and parasitic inductances in the paths between the junction portion 24 and the ground nodes GND become double, as compared with the case of FIG. 13, but can be made smaller than in the case of the comparison example in FIG. 9.

Figure 17:
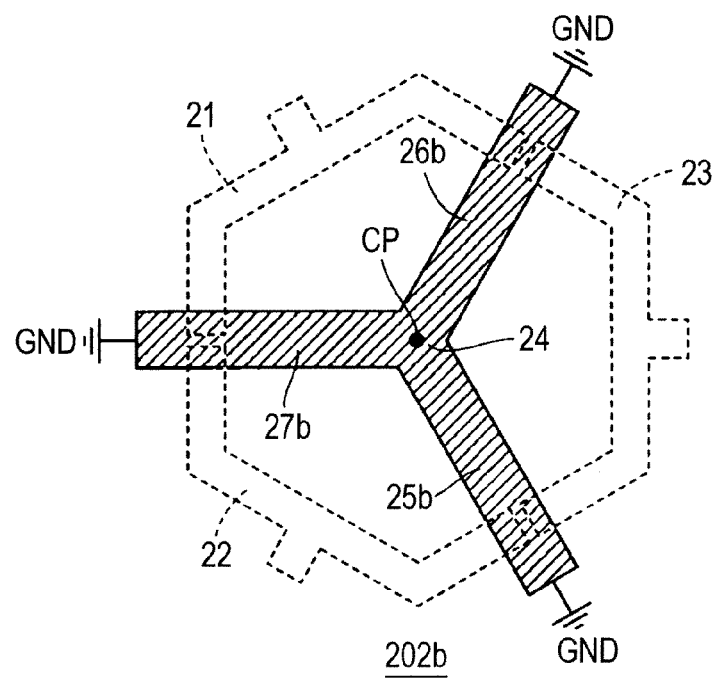
FIG. 17 is a plan view showing a configuration of a ground pattern 202b as another example of modification to the ground pattern 202 in FIG. 15.

FIG. 17 is a plan view showing a configuration of a ground pattern 202b as another example of modification to the ground pattern 202 in FIG. 15. In FIG. 17, the layout of the primary inductor 201 (21, 22, 23) is also shown.

As shown in FIG. 17, the ground pattern 202b may be configured with only the wiring portions 25b, 26b, 27b and the junction portion 24 in FIG. 14. The entire form of the ground pattern 202b is three-turn symmetrical with respect to the central axis CP in FIG. 14 and mirror symmetrical with respect to each of the symmetry planes 25, 26, 27. In this case, parasitic resistances and parasitic inductances in the paths between the junction portion 24 and the ground nodes GND become double, as compared with the case of FIG. 13, but can be made smaller than in the case of the comparison example in FIG. 9.

[Configuration of a Power Amplifier Device 302]

Figure 18:
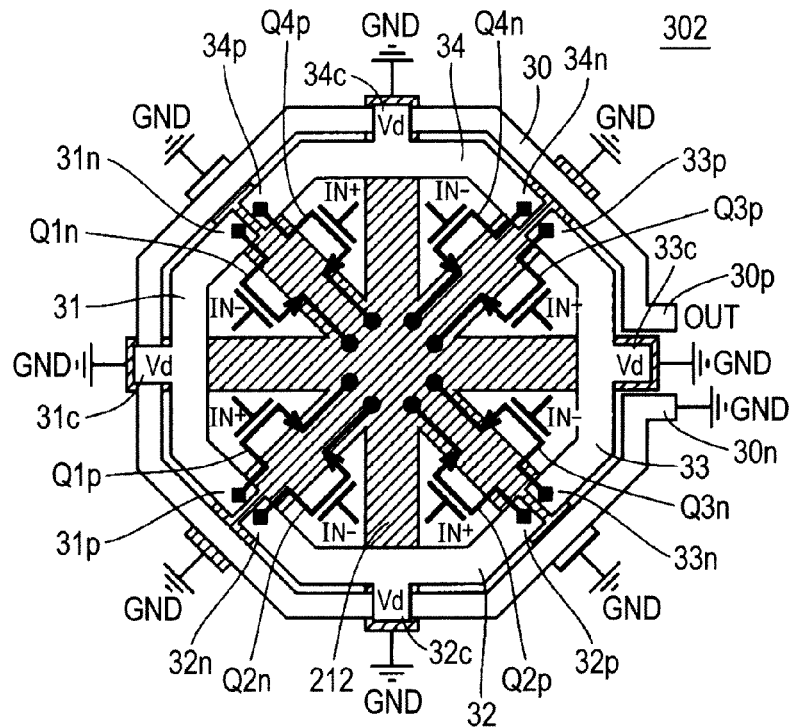
FIG. 18 is a plan view showing a configuration of a power amplifier device 302 according to a first example of modification to the second embodiment of this invention.

FIG. 18 is a plan view showing a configuration of a power amplifier device 302 according to a first example of modification to the second embodiment of this invention. The power amplifier device 302 shown in FIG. 18 is provided over the substrate and includes a primary inductor (denoted by a reference numeral 211 in FIG. 19) comprised of inductor elements 31, 32, 33, 34, a secondary inductor 30, a ground pattern (denoted by a reference numeral 212 in FIG. 20), and four pairs of transistors (Q1p, Q1n), (Q2p, Q2n), (Q3p, Q3n), (Q4p, Q4n).

Figure 19:
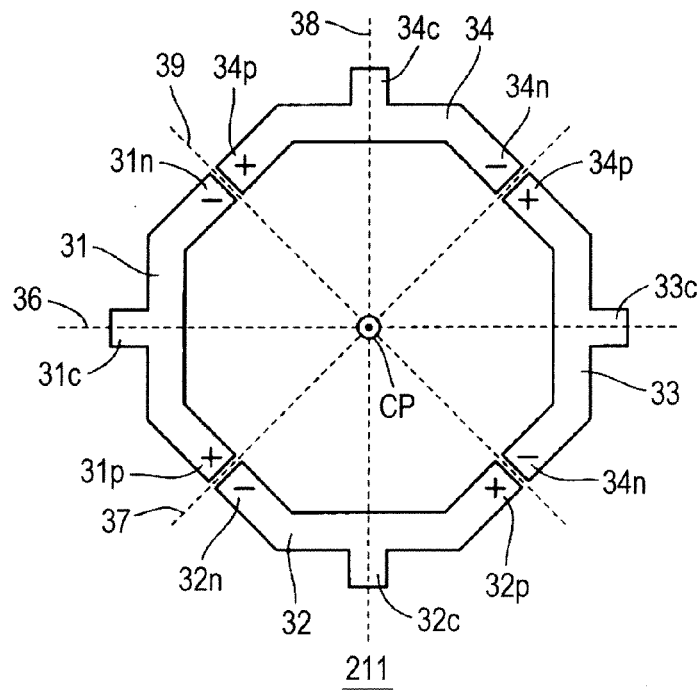
FIG. 19 is a plan view showing a primary inductor part extracted from FIG. 18.

FIG. 19 is a plan view showing the primary inductor part extracted from FIG. 18. Referring to FIG. 19, the primary inductor 211 is comprised of the inductor elements 31, 32, 33, 34 arranged in a generally circular geometry around a central axis CP that is vertical to the substrate. The entire form of the primary inductor 211 is four-turn symmetrical around the central axis CP and mirror symmetrical with respect to each of symmetry planes 36, 37, 38, 39, each of which includes the central axis CP.

Figure 20:
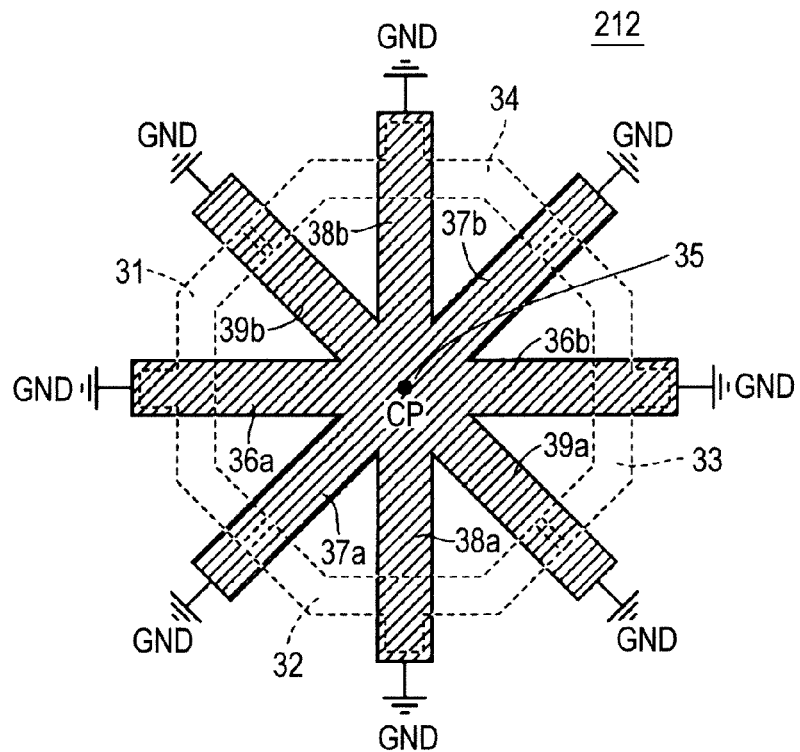
FIG. 20 is a plan view showing a ground pattern part extracted from FIG. 18.

FIG. 20 is a plan view showing the ground pattern part extracted from FIG. 18. With reference to FIG. 20, the ground pattern 212 includes wiring portions 36a, 36b, 37a, 37b, 38a, 38b, 39a, 39b and a junction portion 35. When viewed from the direction perpendicular to the substrate, wiring portions 36a, 36b are laid along a symmetry plane 36 in FIG. 19 and coupled together in the junction portion 35 in the vicinity of the central axis CP in FIG. 19. The wiring portions 36a, 36b are grounded respectively in regions outside of the circular primary inductor 211 (31, 32, 33, 34). When viewed from the direction perpendicular to the substrate, wiring portions 37a, 37b are laid along a symmetry plane 37 in FIG. 19 and coupled together in the junction portion 35. The wiring portions 37a, 37b are grounded respectively in regions outside of the circular primary inductor 211. When viewed from the direction perpendicular to the substrate, wiring portions 38a, 38b are laid along a symmetry plane 38 in FIG. 19 and coupled together in the junction portion 35. The wiring portions 38a, 38b are grounded respectively in regions outside of the circular primary inductor 211. When viewed from the direction perpendicular to the substrate, wiring portions 39a, 39b are laid along a symmetry plane 39 in FIG. 19 and coupled together in the junction portion 35. The wiring portions 39a, 39b are grounded respectively in regions outside of the circular primary inductor 211. Openings like those shown in FIG. 3(B) are further provided in the wiring portions 36a, 36b, 37a, 37b, 38a, 38b, 39a, 39b in FIG. 20, but the openings are omitted from the illustration here. The ground pattern 212 has mirror symmetries with respect to the same rotational symmetry axis CP and mirror symmetry planes 36, 37, 38, 39 as for the primary inductor 211.

Referring to FIG. 18 again, the secondary inductor 30 is arranged circularly so as to surround the primary inductor 211 (31, 32, 33, 34). The secondary inductor 30 produces a combined output of signals which have been input to the inductor elements by magnetically coupling to the primary inductor 211. In a case where the power amplifier device 302 provides differential outputs, differential signals are output from both ends 30p, 30n of the secondary inductor 30. In a case where the power amplifier device 302 provides a single phase output, one end 30n is grounded and a single phase output signal OUT is output from the other end 30p. Although the secondary inductor 30 shown in FIG. 18 has one turn of winding, it may have multiple turns of winding.

Drain electrodes of transistors Q1p, Q1n are coupled to the ends 31p, 31n of the inductor element 31, respectively, and source electrodes thereof are coupled to the junction portion (denoted by a reference numeral 35 in FIG. 20). First and second signals IN+, IN− as differential input signals are input to gate electrodes of the transistor pair Q1p, Q1n. A bias voltage Vd for the transistors Q1p, Q1n is applied to a center tap 31c in the vicinity of a midpoint of the inductor element 31.

Drain electrodes of transistors Q2p, Q2n are coupled to the ends 32p, 32n of the inductor element 32, respectively, and source electrodes thereof are coupled to the junction portion (denoted by the reference numeral 35 in FIG. 20). First and second signals IN+, IN− as differential input signals are input to gate electrodes of the transistor pair Q2p, Q2n. A bias voltage Vd for the transistors Q2p, Q2n is applied to a center tap 32c in the vicinity of a midpoint of the inductor element 32.

Drain electrodes of transistors Q3p, Q3n are coupled to the ends 33p, 33n of the inductor element 33, respectively, and source electrodes thereof are coupled to the junction portion (denoted by the reference numeral 35 in FIG. 20). First and second signals IN+, IN− as differential input signals are input to gate electrodes of the transistor pair Q3p, Q3n. A bias voltage Vd for the transistors Q3p, Q3n is applied to a center tap 33c in the vicinity of a midpoint of the inductor element 33.

Drain electrodes of transistors Q4p, Q4n are coupled to the ends 34p, 34n of the inductor element 34, respectively, and source electrodes thereof are coupled to the junction portion (denoted by the reference numeral 35 in FIG. 20). First and second signals IN+, IN− as differential input signals are input to gate electrodes of the transistor pair Q4p, Q4n. A bias voltage Vd for the transistors Q4p, Q4n is applied to a center tap 34c in the vicinity of a midpoint of the inductor element 34.

By the application of the ground pattern 212, parasitic resistances and parasitic inductances in the paths from the source electrodes of the transistors to the ground nodes GND are reduced by a factor of 8, roughly, as compared with the comparison example in FIG. 9.

[Examples of Modification to the Ground Pattern]

Figure 21:
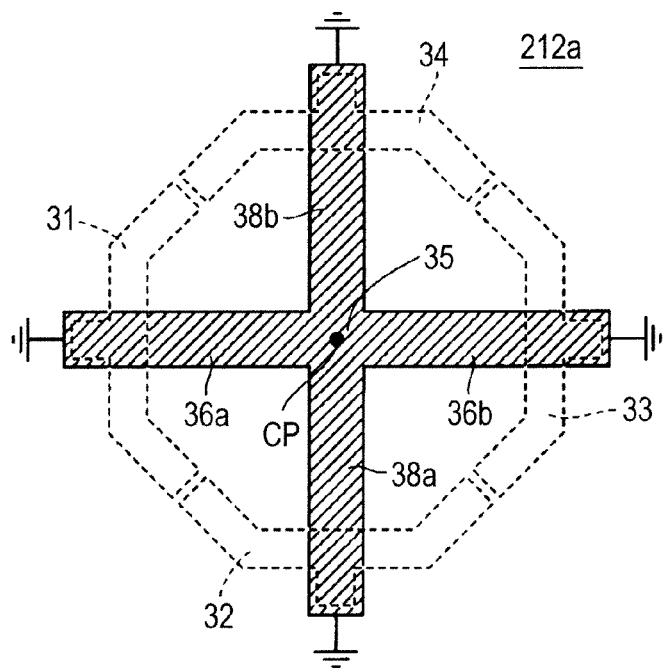
FIG. 21 is a plan view showing a configuration of a ground pattern 212a as an example of modification to the ground pattern 212 in FIG. 20.

FIG. 21 is a plan view showing a configuration of a ground pattern 212a as an example of modification to the ground pattern 212 in FIG. 20. In FIG. 21, the layout of the primary inductor 211 (31, 32, 33, 34) is also shown.

As shown in FIG. 21, the ground pattern 212a may be configured with only the wiring portions 36a, 36b, 38a, 38b and the junction portion 35 in FIG. 19. The entire form of the ground pattern 212a is four-turn symmetrical with respect to the central axis CP in FIG. 19 and mirror symmetrical with respect to each of the symmetry planes 36, 37, 38, 39. In this case, parasitic resistances and parasitic inductances in the paths between the junction portion 35 and the ground nodes GND become double, as compared with the case of FIG. 18, but can be made smaller than in the case of the comparison example in FIG. 9.

Figure 22:
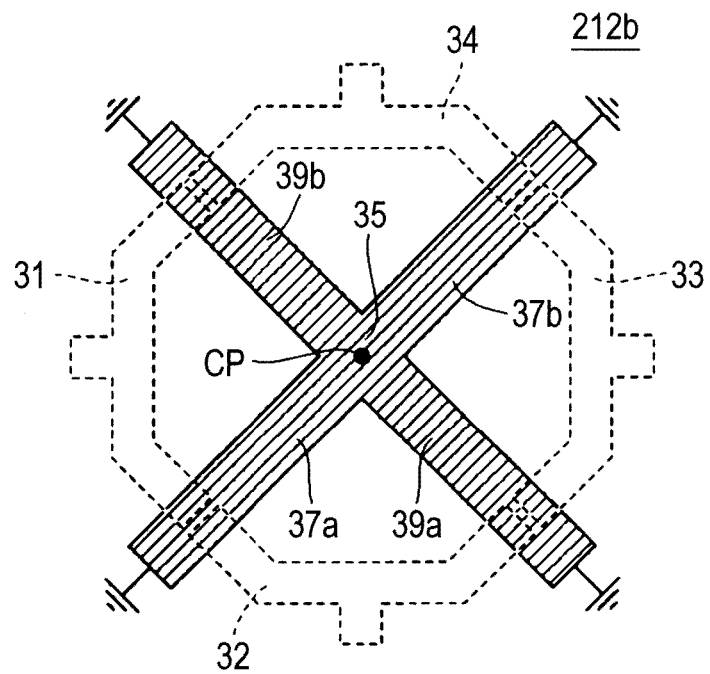
FIG. 22 is a plan view showing a configuration of a ground pattern 212b as another example of modification to the ground pattern 212 in FIG. 20.

FIG. 22 is a plan view showing a configuration of a ground pattern 212b as another example of modification to the ground pattern 212 in FIG. 20. In FIG. 22, the layout of the primary inductor 211 (31, 32, 33, 34) is also shown.

As shown in FIG. 22, the ground pattern 212b may be configured with only the wiring portions 37a, 37b, 39a, 39b and the junction portion 35 in FIG. 19. The entire form of the ground pattern 212b is four-turn symmetrical with respect to the central axis CP in FIG. 19 and mirror symmetrical with respect to each of the symmetry planes 36, 37, 38, 39. In this case, parasitic resistances and parasitic inductances in the paths between the junction portion 35 and the ground nodes GND become double, as compared with the case of FIG. 18, but can be made smaller than in the case of the comparison example in FIG. 9.

[Configuration of a Power Amplifier Device 303]

Figure 23:
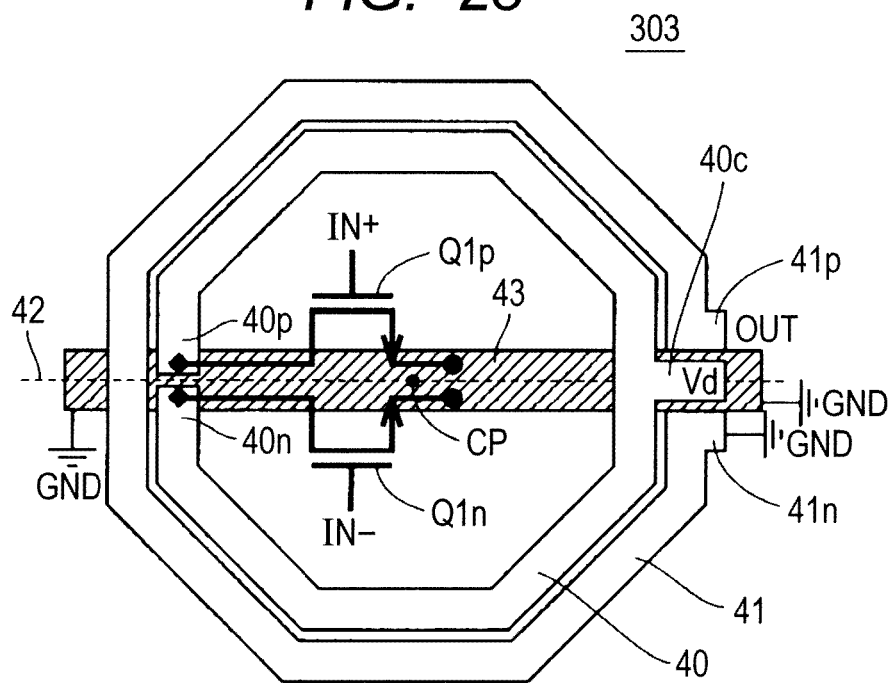
FIG. 23 is a plan view showing a configuration of a power amplifier device 303 according to a second example of modification to the second embodiment of this invention.

FIG. 23 is a plan view showing a configuration of a power amplifier device 303 according to a second example of modification to the second embodiment of this invention. The power amplifier device 303 shown in FIG. 23 is provided over the substrate and includes a primary inductor 40, a secondary inductor 41, a ground pattern 43, and one pair of transistors (Q1p, Q1n).

The primary inductor 40 is provided in a generally circular geometry around a central axis CP that is vertical to the substrate. The entire form of the primary inductor 40 is mirror symmetrical with respect to a symmetry plane 42 including the central axis CP.

The ground pattern 43 is a wiring that is laid along the symmetry plane 42, when viewed from the direction perpendicular to the substrate, and extends from an outside region at one side of the primary inductor 40 into an outside region at the opposite side thereof. The ground pattern 43 is grounded at both ends. The ground pattern 43 can be regarded as a structure in which two wiring portions along the symmetry plane 42 are coupled together in a junction portion in the vicinity of the central axis CP.

The secondary inductor 41 is provided circularly so as to surround the primary inductor 40. The secondary inductor 41 outputs a signal that has been input to the primary inductor 40 by magnetically coupling to the primary inductor 40. In a case where the power amplifier device 303 provides differential outputs, differential signals are output from both ends 41p, 41n of the secondary inductor 41. In a case where the power amplifier device 303 provides a single phase output, one end 41n is grounded and a single phase output signal OUT is output from the other end 41p. Although the primary inductor 40 and the secondary inductor 41 shown in FIG. 23 have one turn of winding, they may have multiple turns of winding.

Drain electrodes of transistors Q1p, Q1n are coupled to the ends 40p, 40n of the primary inductor 40, respectively, and source electrodes thereof are coupled to the ground pattern 43. First and second signals IN+, IN− as differential input signals are input to gate electrodes of the transistor pair Q1p, Q1n. A bias voltage Vd for the transistors Q1p, Q1n is applied to a center tap 40c in the vicinity of a midpoint of the primary inductor 40.

By the application of the ground pattern 43, parasitic resistances and parasitic inductances in the paths from the source electrodes of the transistors to the ground nodes GND are reduced by a factor of 2, roughly, as compared with the comparison example in FIG. 9.

Third Embodiment

Configuration of a Power Amplifier Device 304

Figure 24:
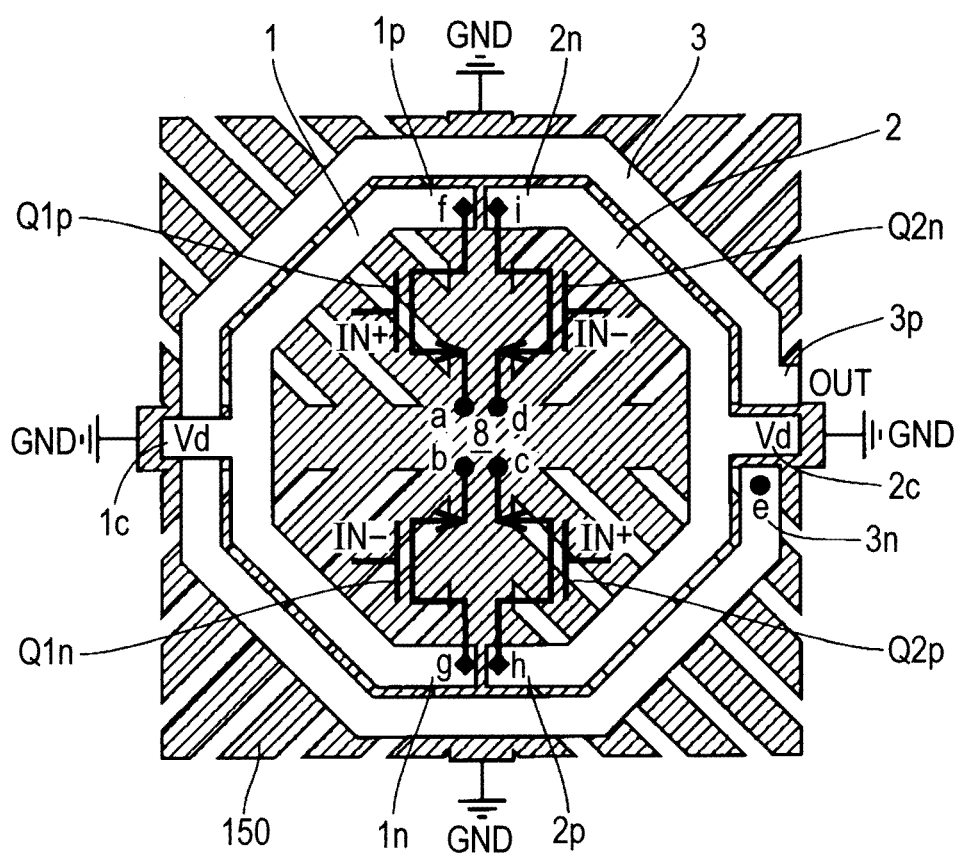
FIG. 24 is a plan view showing a configuration of a power amplifier device 304 according to a third embodiment of this invention.

FIG. 24 is a plan view showing a configuration of a power amplifier device 304 according to a third embodiment of this invention.

Figure 25:
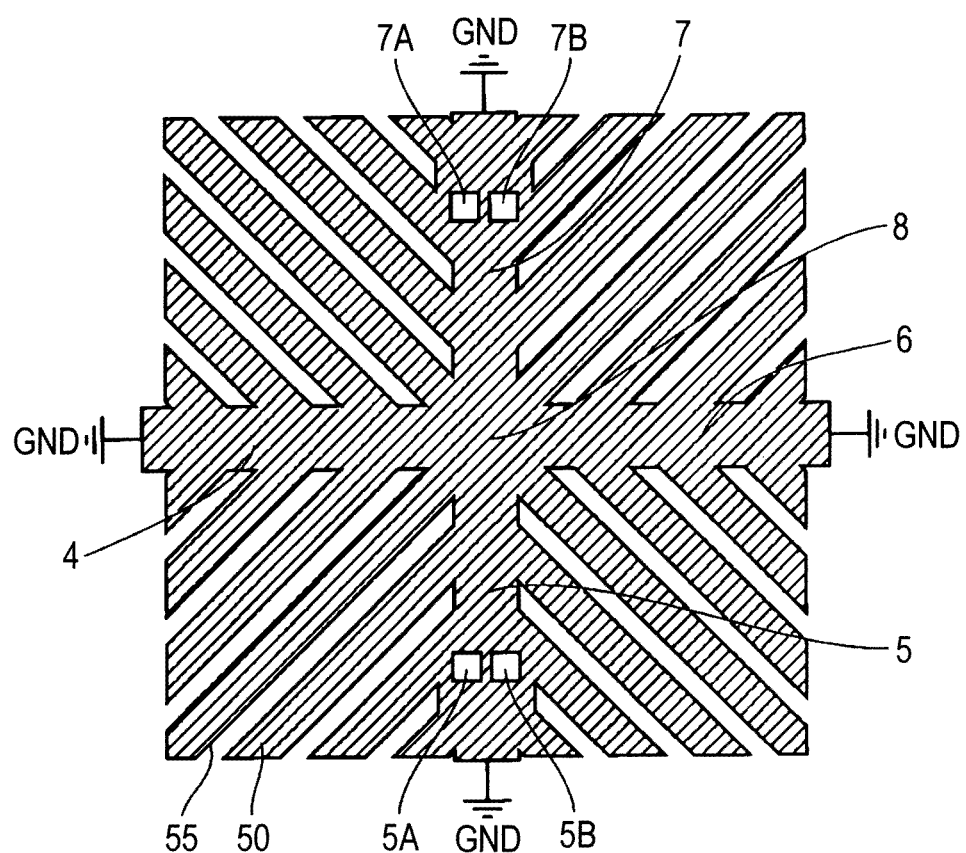
FIG. 25 shows a ground pattern 150 extracted from FIG. 24.

FIG. 25 shows a ground pattern 150 extracted from FIG. 24. With reference to FIGS. 24 and 25, the ground pattern 150 is regarded as a patterned ground shield 150 formed by adding multiple open stubs (wring portions) 50 intersecting the transformer (primary inductors 1, 2 and secondary inductor 3) at 45° or 90° to the ground pattern 102 shown in FIG. 3(B). The entire form of the multiple open stubs (wiring portions) 50 is four-turn symmetrical around the central axis CP and mirror symmetrical with respect to the symmetry planes 9, 10 of the primary inductor elements 1, 2 shown in FIG. 4. Preferably, the overall size of the ground pattern 150 is somewhat larger than the size of the transformer, when viewed from the direction perpendicular to the substrate.

When the transistors Q1p, Q1n, Q2p, Q2n are disposed inside the transformer (primary inductors 1, 2 and secondary inductor 3), it is a concern that electrically conducting parts (aluminum wiring leads and impurity regions) in the transistors are magnetically coupled to the wiring portions of the transformer due to the fact that the transistors are located in a zone into which magnetic fluxes of the transformer concentrate. Magnetic coupling between the transformer and the transistors causes an unexpected backward current which results in a decrease in the output of the power amplifier device. Therefore, in the power amplifier device 304 of the third embodiment, the transformer (primary inductors 1, 2 and secondary inductor 3) and the transistors Q1p, Q1n, Q2p, Q2n are spatially separated by the patterned ground shield 150 and magnetic coupling between both is thus blocked to a certain extent.

Use of the ground pattern 150 having the geometry as shown in FIG. 25 still maintains the effect of significantly reducing parasitic resistances and parasitic inductances in the paths from the source electrodes of the transistors to the ground nodes GND. However, the use of the patterned ground shield 150 has no small effect on the RF characteristic of the transformer, as compared with the case of the first embodiment. Generally, the use of such shield results in a decrease in substrate loss, that is, an increase of Q value and a decrease of self-resonant frequency of the inductors configuring the transformer.

Other respects in FIGS. 24 and 25 are the same as in FIGS. 2 and 3(A) thru 3(C) and, therefore, same or corresponding parts are assigned the same reference designators and their description is not repeated.

Figure 26A:
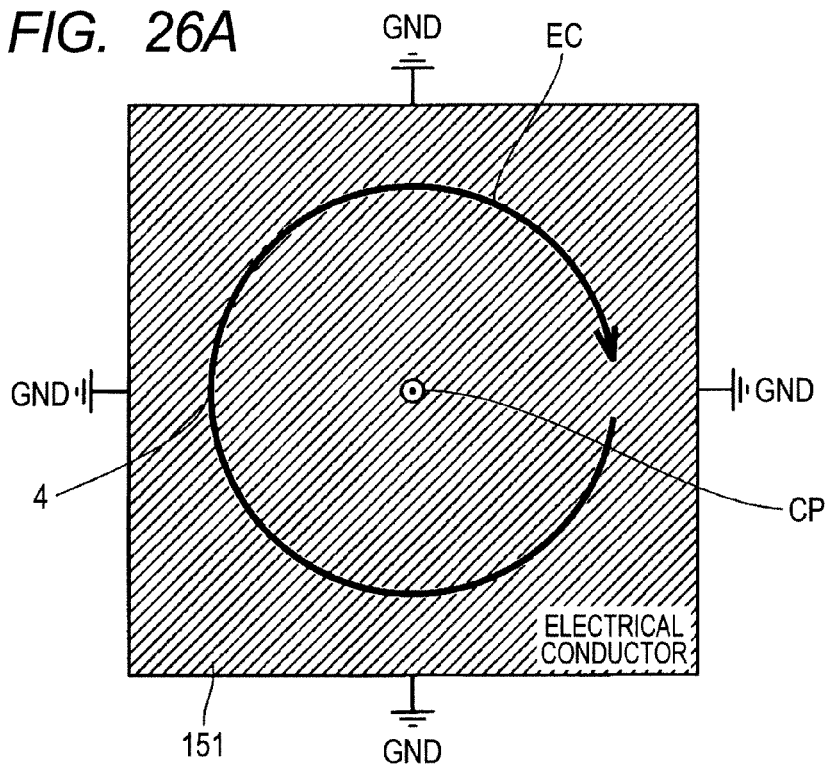
FIGS. 26(A) and 26(B) are diagrams to further explain the effect of the ground pattern 150 in FIG. 25.
Figure 26B:
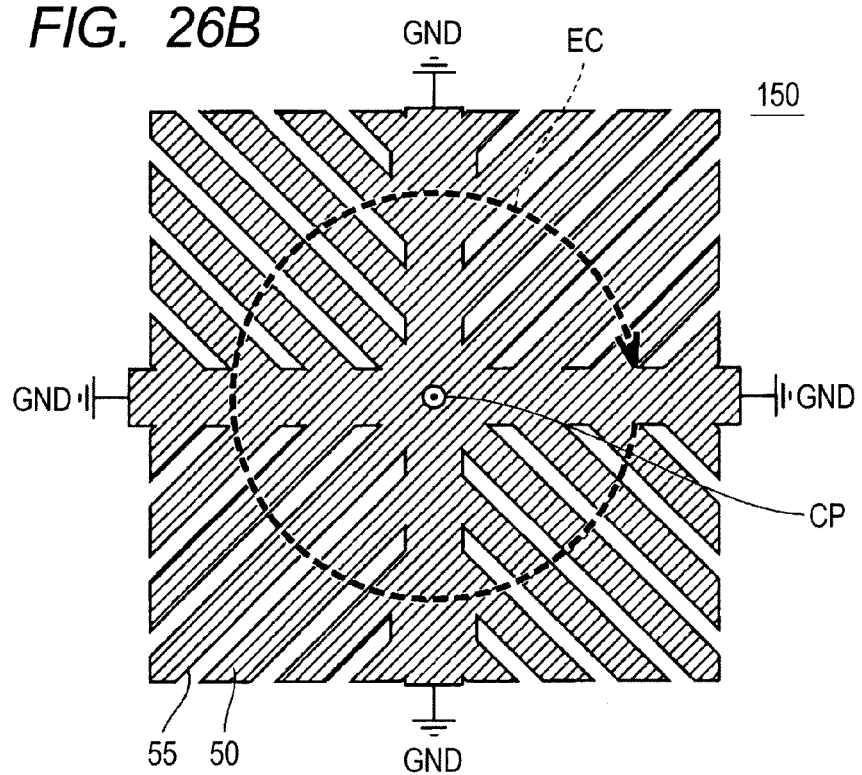

FIGS. 26(A) and 26(B) are diagrams to further explain the effect of the ground pattern 150 in FIG. 25. FIG. 26(A) is a diagram showing a comparison example where a single monolithic shield film 150 is provided instead of the ground pattern 150. FIG. 26(B) depicts the ground pattern 150 in FIG. 25 in contrast to the shield film 151 of FIG. 26(A).

Generally, a patterned ground shield is provided to inhibit coupling between an inductor (including a transformer) and a lossy substrate via an oxide film. However, when the monolithic shield film 151 is provided, a large eddy current EC is generated in the shield film 151 by induced electromotive force and a large energy loss occurs. This is because it is impossible to realize a shield film completely fixed to a ground potential, due to the fact that the shield film 151 has a finite resistance.

Therefore, by making multiple slits 55 in the shield film, as shown in FIG. 26(B), a path through which the eddy current flows (a round path around the central axis CP) is cut off, except for a region in the vicinity of the central axis CP. Although a small eddy current is actually generated even in the patterned ground shield 150, it is possible to reduce the energy loss due to the eddy current, as compared with the case of FIG. 26(A).

Higher is the magnetic shielding effect produced by the monolithic shield film 151 in which a large magnetic flux in a reverse direction (to counteract an original magnetic flux) is generated with a large eddy current. However, the shield film 151 cannot be used because of the energy loss. Thus, the patterned ground shield 150 is used, even though the magnetic shielding effect is weaker than the monolithic shield film 151.

Furthermore, by providing the patterned ground shield 150, it is possible to inhibit a crosstalk via parasitic capacitances between the transformer (primary inductors 1, 2 and secondary inductor 3) and the transistors Q1p, Q1n, Q2p, Q2n. This crosstalk inhibiting effect is significant, particularly when the transformer and the transistors are provided such that both are partially overlapping.

Referring to FIGS. 24 and 25 again, it is preferable to orient the stubs (wiring portions) 50 to be orthogonal to the wiring parts (conductors) of the transformer (primary inductors 1, 2 and secondary inductor 3), wherever possible, when viewed from the direction perpendicular to the substrate.

If the width of the stubs (wiring portions) 50 is too wide, the energy loss increases, because the effect of cutting off the path through which the eddy current flows is reduced. On the other hand, if the width of the stubs (wiring portions) 50 is narrow, the parasitic resistances of the stubs increase. This increases the loss of an RF signal in the paths between the wiring parts (conductors) of the transformer and the ground nodes GND (that is, the paths from the wiring parts (conductors) of the transformer extending to the stubs (wiring portions) 50 by capacitance coupling and up to the ground nodes GND via the stubs (wiring portions) 50). In consequence, this weakens the effect of inhibiting the crosstalk via parasitic capacitance between the transformer and the transistors. Therefore, an optimal width of the stubs (wiring portions) 50 should be selected.

Preferably, the width of the slits 55 (the gap between two stubs) should usually be narrower in order to increase the proportion of covering the transformer with the shield.

The number of the stubs is determined by an area required to cover the transformer to a sufficient extent, an optimal width of the stubs, and a minimum gap between two stubs determined by a design rule.

[First Example of Modification to the Third Embodiment]

Figure 27:
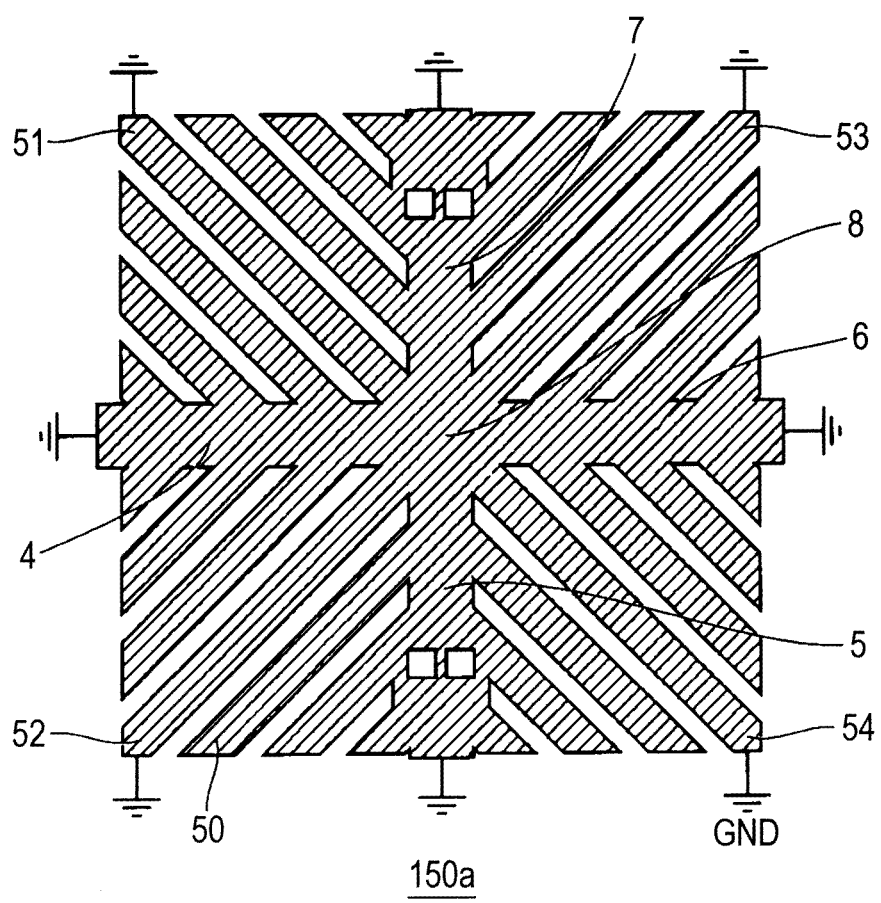
FIG. 27 is a plan view showing a configuration of a ground pattern 150a as an example of modification to the ground pattern in FIG. 25.

FIG. 27 is a plan view showing a configuration of a ground pattern 150a as an example of modification to the ground pattern in FIG. 25. The geometry of the ground pattern 150a in FIG. 27 is the same as the ground pattern 150 in FIG. 25, but there is a difference in coupling to ground nodes GND. In the case of FIG. 27, the ends of wiring portions 51, 52, 53, 54 coupled together in the junction portion 8 are further grounded. Thereby, it is possible to further reduce parasitic resistances and parasitic inductances in the paths between the source electrodes of the transistors Q1p, Q1n, Q2p, Q2n and the ground nodes GND. More ground points may be provided and the ends of all wiring portions 50 may be grounded.

[Second Example of Modification to the Third Embodiment]

Figure 28A:
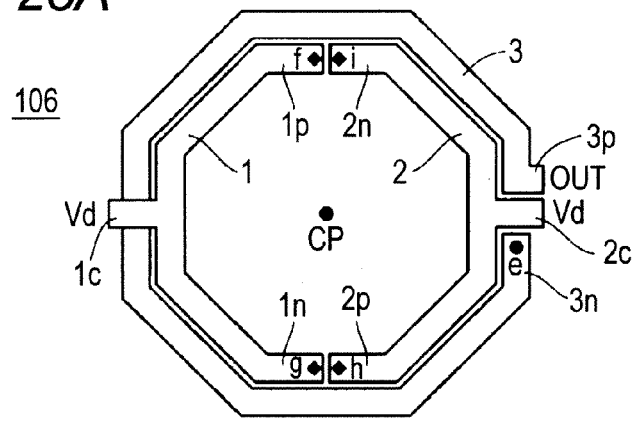
FIGS. 28(A), 28(B), and 28(C) are plan views showing a configuration of a power amplifier device as a second example of modification of the third embodiment of this invention.
Figure 28B:
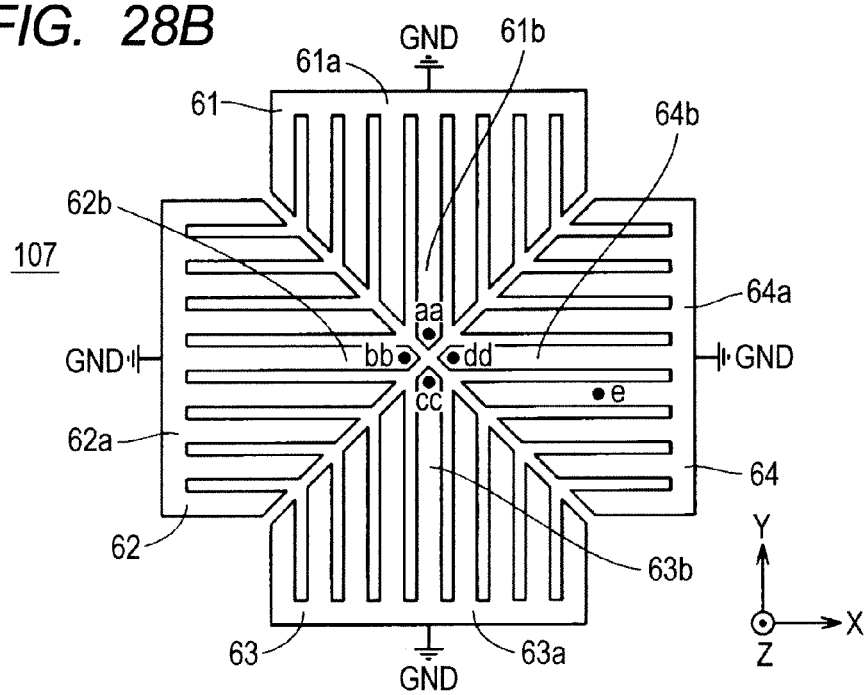
Figure 28C:
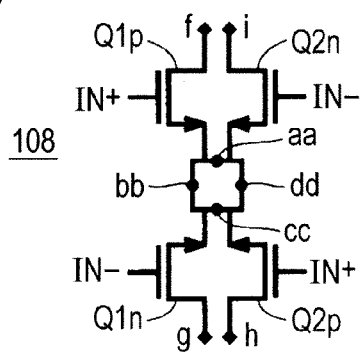

FIGS. 28(A), 28(B), and 28(C) are plan views showing a configuration of a power amplifier device as a second example of modification of the third embodiment of this invention.

FIG. 28(A) shows the configuration of a transformer 106 comprised of primary inductors 1, 2 and secondary inductor 3. The configuration of the transformer 106 is the same as the transformer 101 in FIG. 3(A) and, therefore, the description thereof is not repeated.

FIG. 28(B) is a plan view showing the geometry of a ground pattern 107. The ground pattern 107 includes comb-shaped partial patterns 61 to 64 (referred to as comb-shaped portions) separated from each other by slits. The comb-shaped portions 61 to 64 include roots 61a to 64a coupled to ground nodes GND, respectively. A plurality of wiring portions are joined to the root of each of the comb-shaped portions 61 to 64. In other words, the ground pattern 107 has the geometry made from a single plane pattern extending from a region inside the transformer 106 into regions outside the transformer 106, when viewed from the direction perpendicular to the substrate. A plurality of slit openings are made in the plane pattern in directions intersecting the primary inductors 1, 2, so that no closed round path is formed around the central axis CP.

A comb-shaped portion 64 is coupled to one end 3n of the secondary inductor 3 via a contact hole e. The geometry of the ground pattern 107 in FIG. 28(B) has rotational symmetries and mirror symmetries like the primary inductors 1, 2.

FIG. 28(C) is a diagram schematically showing the layout of the transistors Q1p, Q1n, Q2p, Q2n.

As shown in FIG. 28(C), the drain electrode of a transistor Q1p is coupled to one end 1p of the inductor element 1 via a contact hole f and the drain electrode of a transistor Q1n is coupled to the other end 1n of the inductor element 1 via a contact hole g. The drain electrode of a transistor Q2p is coupled to one end 2p of the inductor element 2 via a contact hole h and the drain electrode of a transistor Q2n is coupled to the other end 2n of the inductor element 2 via a contact hole i.

The source electrodes of the transistors Q1p, Q1n, Q2p, Q2n are inter-coupled together and unified. The unified source electrodes are coupled to the wiring portion 61b of a comb-shaped portion 61 via a contact hole aa, coupled to the wiring portion 62b of a comb-shaped portion 62 via a contact hole bb, coupled to the wiring portion 63b of a comb-shaped portion 63 via a contact hole cc, and coupled to the wiring portion 64b of a comb-shaped portion 64 via a contact hole dd. Thereby, electrical conduction is provided between the source electrodes and the ground nodes GND.

Fourth Embodiment

Figure 29:
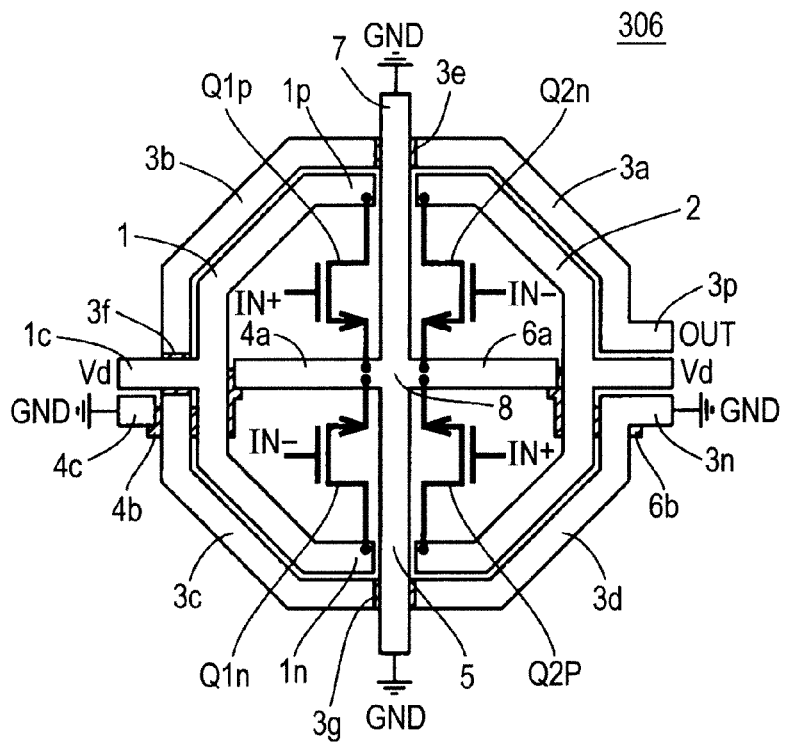
FIG. 29 is a plan view showing a configuration of a power amplifier device 306 according to a fourth embodiment of this invention.

FIG. 29 is a plan view showing a configuration of a power amplifier device 306 according to a fourth embodiment of this invention.

Figure 30:
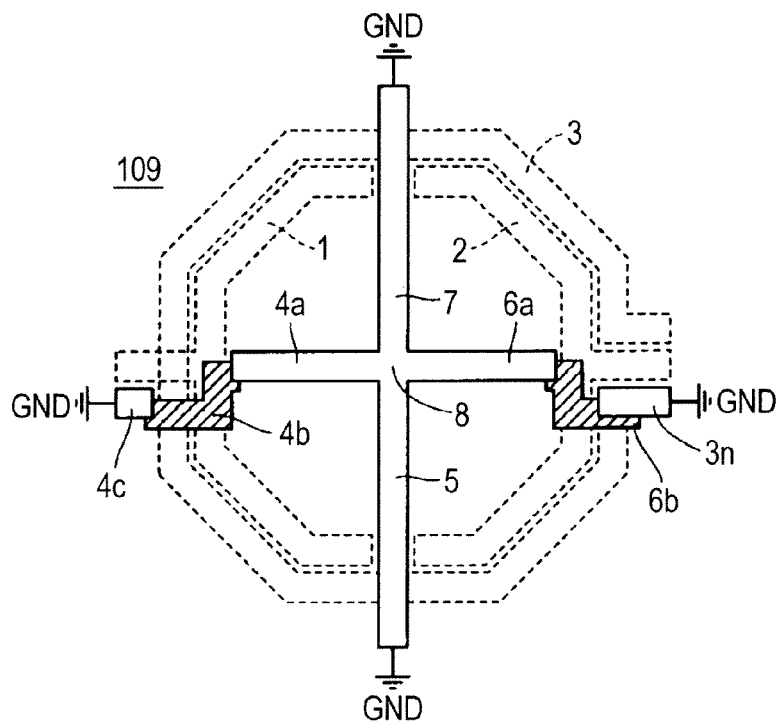
FIG. 30 is a plan view showing a ground pattern 109 part extracted from FIG. 29.

FIG. 30 is a plan view showing a ground pattern 109 part extracted from FIG. 29. In FIG. 30, the layout of the primary inductors 1, 2 and secondary inductor 3 is also shown.

In the first embodiment, the transformer 101, the ground pattern 102, and the electrodes (metal wring leads) of the transistors Q1p, Q1n, Q2p, Q2n are formed using different metal wiring layers from each other. In the power amplifier device 306 of the fourth embodiment, the transformer (primary inductors 1, 2 and secondary inductor 3) and the ground pattern 109 are formed using a same metal wiring layer, except for portions overlapping with each other. Since a top metal wiring layer generally has a lower sheet resistance than other metal wiring layers, it is possible to further reduce parasitic resistances in the paths between the source electrodes of the transistors and the ground nodes.

Referring to FIG. 29, the power amplifier device 306 is formed using a first metal layer provided over the substrate and a second metal layer provided above the first metal layer. Wiring portions formed using the first metal layer are hatched in order to clarify the illustration.

The primary inductor includes inductor elements 1, 2, both of which are formed using the second metal layer at the top. The secondary inductor includes wiring portions 3a, 3b, 3c, 3d and wiring portions 3e, 3f, 3g formed using the first metal layer. The wiring portion 3e is provided in a location overlapping with a wiring portion 7 comprised in the ground pattern 109 and coupled to the wiring portions 3a, 3b via contact holes. The wring portion 3f is provided in a location overlapping with a center tap 1c of the inductor element 1 and coupled to the wiring portions 3b, 3c via contact holes. The wiring portion 3g is provided in a location overlapping with a wiring portion 5 comprised in the ground pattern 109 and coupled to the wiring portions 3c, 3d via contact holes.

Referring to FIG. 30, the ground pattern 109 includes wring portions 4a, 5, 6a, 7, 4c and a junction portion 8 formed using the second metal layer and wiring portions 4b, 6b formed using the first metal layer. The junction portion 8 is formed in the vicinity of the central axis of the primary inductor and joins the wiring portions 4a, 5, 6a, 7. The wiring portion 4b is provided in a location overlapping with the inductor element 1 and the wiring portion 3c and coupled to the wiring portions 4a, 4c via contact holes. The wiring portion 6b is provided in a location overlapping with the inductor element 2 and the wiring portion 3d and coupled to the wiring portion 6a and the end 3n of the wiring portion 3d via contact holes.

In a case where the transistors Q1p, Q1n, Q2p, Q2n are arranged in a region where wiring of the transformer and wiring of the ground pattern do not exist, as in FIG. 29, wiring for the electrodes of the transistors can be formed in the same wiring layer in which the transformer and the ground pattern are formed. In that case, however, the patterned ground shield described in the third embodiment cannot be used as the ground pattern.

In the drawings used to explain the first to fourth embodiments, the transformer is illustrated which comprises the primary inductor forming a single turn as a whole and the secondary inductor which is also a single turn. The transformer that can be used in the first to fourth embodiments is not limited to the illustrated one. That is, the secondary inductor or both the primary and secondary inductors may be multiple turns.

The embodiments disclosed herein should be considered as illustrative in all respects, rather than restrictive. The scope of the present invention is indicated by the appended claims, rather than by the foregoing descriptions, and all changes which come within the meaning and range of equivalency of the claims are therefore intended to be embraced therein.

What is claimed is:

1. A power amplifier device, comprising:
a primary inductor comprising a plurality of inductor elements in plan view;
a ground pattern provided to extend from a portion of a region inside the primary inductor outside the primary inductor, in plan view;
a plurality of transistor pairs, each being provided for linking with each of the plurality of inductor elements; and
a secondary inductor including one turn of winding or multiple turns of winding, the secondary inductor provided so as to surround the primary inductor,
wherein, to both ends of each of the plurality of inductor elements, first main electrodes of first and second transistors forming a transistor pair in linkage with the inductor element are coupled respectively, and
wherein second main electrodes of the first and second transistors are coupled to the ground pattern in the region inside the primary inductor.

2. The power amplifier device according to claim 1, wherein the primary inductor is arranged in a generally circular geometry, and the ground pattern is provided to extend from a portion of a region inside the primary inductor which is circular into regions outside the primary inductor, in plan view.

3. The power amplifier device according to claim 1, wherein the secondary inductor is provided circularly so as to surround the primary inductor.

4. The power amplifier device according to claim 1, wherein the ground pattern includes a plurality of points which are in the regions outside the primary inductor, and the ground pattern is grounded at the plurality of points.

5. The power amplifier device according to claim 1, wherein first and second signals in a pair as differential input signals are supplied to control electrodes of the first and second transistors, respectively.

6. The power amplifier device according to claim 5, wherein the secondary inductor further combines and outputs combined signals of the first and second signals combined in each of the inductor elements by magnetically coupling to the primary inductor.

7. A power amplifier device formed over a substrate, comprising:
a primary inductor which includes one turn of winding or multiple turns of winding, in plan view;
a ground pattern provided to extend from a portion of a region inside the primary inductor outside the primary inductor, in plan view;
a transistor pair provided over the substrate; and
a secondary inductor comprising one turn of winding or multiple turns of winding, the secondary inductor provided so as to surround the primary inductor,
wherein, to both ends of the primary inductor, first main electrodes of first and second transistors forming the transistor pair are coupled respectively, and
wherein second main electrodes of the first and second transistors are coupled to the ground pattern in the region inside the primary inductor.

* * * * *